(12) United States Patent
Mitarai et al.

(10) Patent No.: US 9,723,724 B2
(45) Date of Patent: Aug. 1, 2017

(54) WIRING SUBSTRATE, METHOD OF MANUFACTURING WIRING SUBSTRATE, COMPONENT-EMBEDDED GLASS SUBSTRATE, AND METHOD OF MANUFACTURING COMPONENT-EMBEDDED GLASS SUBSTRATE

(71) Applicant: Sony Corporation, Tokyo (JP)

(72) Inventors: Shun Mitarai, Kanagawa (JP);
Shusaku Yanagawa, Kanagawa (JP);
Shinji Rokuhara, Kanagawa (JP);
Shuichi Oka, Kanagawa (JP)

(73) Assignee: Sony Corporation, Tokyo (JP)

( * ) Notice: Subject to any disclaimer, the term of this patent is extended or adjusted under 35 U.S.C. 154(b) by 28 days.

(21) Appl. No.: 14/327,389

(22) Filed: Jul. 9, 2014

(65) Prior Publication Data

US 2015/0021081 A1    Jan. 22, 2015

(30) Foreign Application Priority Data

Jul. 16, 2013  (JP) ................................. 2013-147551
May 8, 2014   (JP) ................................. 2014-096477

(51) Int. Cl.
| | |
|---|---|
| *H05K 1/16* | (2006.01) |
| *H05K 3/10* | (2006.01) |
| *H05K 1/11* | (2006.01) |
| *H05K 1/18* | (2006.01) |
| *H05K 3/30* | (2006.01) |
| *H01L 27/12* | (2006.01) |

(Continued)

(52) U.S. Cl.
CPC ............. *H05K 3/10* (2013.01); *H01L 21/486* (2013.01); *H01L 23/15* (2013.01); *H01L 23/5384* (2013.01); *H01L 23/5385* (2013.01); *H01L 23/5389* (2013.01); *H01L 27/124* (2013.01); *H01L 27/1218* (2013.01); *H05K 1/115* (2013.01); *H05K 1/185* (2013.01); *H05K 1/186* (2013.01); *H05K 3/30* (2013.01); *H05K 3/4697* (2013.01); *H01L 27/3276* (2013.01); *H01L 2224/16225* (2013.01); *H01L 2224/73253* (2013.01); *H05K 3/42* (2013.01); *H05K 3/4605* (2013.01); *Y10T 29/4913* (2015.01); *Y10T 29/49155* (2015.01)

(58) Field of Classification Search
CPC .......... H05K 3/10; H05K 1/115; H05K 1/185; H01L 21/486; H01L 23/15; H01L 23/5385
USPC ........ 174/260, 250, 251, 255–258, 261, 262
See application file for complete search history.

(56) References Cited

U.S. PATENT DOCUMENTS

| | | | |
|---|---|---|---|
| 9,320,185 B2 * | 4/2016 | Imamura | ............ H05K 13/0023 |
| 2009/0002958 A1 * | 1/2009 | Li | ........................ H05K 3/0032 361/748 |

(Continued)

*Primary Examiner* — Tremesha S Willis
(74) *Attorney, Agent, or Firm* — Sheridan Ross P.C.

(57) ABSTRACT

A method of manufacturing a wiring substrate that has a wiring including a through glass via and is formed of a glass substrate includes forming an alteration layer that penetrates the wiring substrate and is patterned, forming the wiring on a front surface of the wiring substrate in which the alteration layer has been formed, and filling an electrode material in a hole formed by removing the alteration layer, thereby forming the through glass via that connects the wiring on the front surface of the wiring substrate and the wiring on a back surface side thereof.

8 Claims, 13 Drawing Sheets

(51) Int. Cl.
*H01L 23/15* (2006.01)
*H01L 21/48* (2006.01)
*H01L 23/538* (2006.01)
H05K 3/42 (2006.01)
H05K 3/46 (2006.01)
H01L 27/32 (2006.01)

(56) References Cited

U.S. PATENT DOCUMENTS

2010/0103635 A1* 4/2010 Tuominen ........... H01L 23/5389
361/764
2012/0247814 A1* 10/2012 Shimizu .............. H01L 21/4857
174/251
2013/0245167 A1* 9/2013 Okaniwa ............. H01L 21/0212
524/104
2014/0013804 A1* 1/2014 Ono .................... C03C 23/0025
65/43

* cited by examiner

WIRING SUBSTRATE, METHOD OF MANUFACTURING WIRING SUBSTRATE, COMPONENT-EMBEDDED GLASS SUBSTRATE, AND METHOD OF MANUFACTURING COMPONENT-EMBEDDED GLASS SUBSTRATE

CROSS REFERENCE TO RELATED APPLICATIONS

This application claims the benefit of Japanese Priority Patent Application JP 2013-147551 filed Jul. 16, 2013 and Japanese Priority Patent Application JP 2014-096477 filed May 8, 2014, the entire contents of each of which are incorporated herein by reference.

BACKGROUND

The present technology relates to a wiring substrate, a method of manufacturing a wiring substrate, a component-embedded glass substrate, and a method of manufacturing a component-embedded glass substrate, and more particularly to a wiring substrate, a method of manufacturing a wiring substrate, a component-embedded glass substrate, and a method of manufacturing a component-embedded glass substrate, which make it possible to suppress characteristic variation of an active element provided on the wiring substrate.

A glass wiring substrate on an entire surface of which an active element such as a TFT (Thin Film Transistor) is provided is widely used for an active-matrix liquid crystal display, an organic EL (Electro-Luminescence) display, or the like. Those displays are increasingly large-sized along with development of high-definition television broadcast. Mother glasses used to manufacture those panels are also increasingly large-sized year by year. Currently, the glasses are manufactured in size of 2880 mm×3130 mm, which is called the tenth generation.

On the other hand, an interposer substrate used for a package of an IC (Integrated Circuit) is started to be commercially practical as a package form of a high-performance IC, because microfabrication of wirings, which has reached a deadlock for an organic resin substrate, can be carried out by using Si (Silicon) substrate.

However, the interposer substrate made of a Si substrate is expensive, which is disincentive to develop the substrate with respect to other IC packages except some high-end products. Under the circumstances, expectations have raised for use of a "large-sized glass substrate that allows fine wirings" as the interposer substrate, which can be more inexpensive by increasing the number of extractions.

Behind the expectations, there is the fact that a technology for processing vias in a glass substrate has been developed, for example. To use a glass substrate for the interposer, through glass vias (TGVs) that penetrate the substrate to connect wirings between a front surface and a back surface are necessary. For this reason, a practical processing technology is demanded which makes it possible to form a great number of fine vias in a glass substrate at a low cost. As a technology in related art for forming fine holes in glass, abrasion by using laser is known. However, for an interposer use in which a great number of vias are necessary, it is almost impossible to achieve practical manufacture thereof due to a processing time period and a total thereof by sequential processes. In recent years, as a technology instead thereof, a via opening technology by using electrical discharge machining or photosensitive glass has been developed.

An example of the via opening technology includes a machining method such as focused electrical discharging. By the focused electrical discharging, it is possible to form vias in a glass substrate in a short time of 1 msec/via (see, 45th International Symposium on Microelectronics (IMAPS 2012), Proceedings, TP13, 2012). In the machining method, after the vias are formed, it is necessary perform a heat treatment at approximately a softening point of glass in order to relieve a stress on opening portions.

Further, as another via opening technology, a technology for forming vias by using photosensitive glass has been developed (see, NEW GLASS, p. 75-80, Vol. 22, No. 1, 2007, and 45th International Symposium on Microelectronics (IMAPS 2012), Proceedings, TP12, 2012).

SUMMARY

The via opening technology for glass described above is mainly used for formation of TGVs (Through Glass Vias) including a metal filling process in the vias thereafter. In the case where a substrate with the TGV is used for the interposer use, in a manufacturing method thereof, a TGV forming process is performed, and then a wiring process is performed approximately (so-called via-first process). This is because there is a high consistency in processes. For example, for the via opening technology described above, a heat treatment has to be performed in many cases at temperature exceeding a heat resistance of the wiring process, and metal filled in the TGVs does not become a contamination source with respect to the subsequent wiring process, and in some cases, the metal filling process in the TGVs can be a first wiring layer forming process.

In the case where an active element such as a TFT is formed on the glass wiring substrate with the TGVs by using the via-first process, however, a metal material used for the TGVs becomes a contamination source that affects characteristic variation of the active element. For example, Cu (copper), which is a proven filling material for a TSV (Through Silicon Via) in a Si interposer, has a low resistance out of metals and is a promising material also for the TGV use.

However, if the material exists as the contamination source, the material becomes a factor that causes a threshold voltage of the TFT to vary. When an operation voltage is increased to absorb this, power consumption is increased. Further, unlike a manufacture line of an LSI (Large Scale Integration), in a large-sized TFT manufacture line, effective washing technology or equipment against metal contamination is not generally provided. Under such an environment, it is very difficult to use a substrate in which metal such as Cu is formed is used as a base and prevent contamination with respect to a TFT formed thereon.

In related art, for a TFT substrate for a display use, on one surface of a mother glass, only a TFT and a wiring are formed, and a TGV is unnecessary. However, for a further increase in size or a further reduction in frame area in the future, expectations are being raised for a technology of connecting a plurality of panels with such sizes as to maintain high yield to increase in size or a technology of drawing out a wiring to a back surface side of a panel by using a TGV to provide an IC or a part on the back surface side thereof, for example, also for the display use.

As described above, the via-first process of TGV based on a commercialization technology of opening vias in glass is consistent with the interposer substrate use, but for a use of forming an active element such as a TFT on a TGV substrate, a metal material filled in the TGVs becomes a contamination source, so effectively the process is difficult to be used.

As a countermeasure against those, a manufacturing method can be conceived in which a metal material that is to be a contamination source is filled in the vias after an active element is formed. However, to form the active element or a wiring on the substrate in which the vias are opened, it is necessary to flatten the glass substrate by, for example, filling a substitute material for a process fluctuation thereof. For example, the following process has been proposed, although a purpose is different. With respect to a silicon substrate, a via larger than the via is formed in advance, a substitute material which can be easily removed such as resin is filled, and then the resin is processed, thereby easily forming a fine via. From such cases in the past, the following method can also be conceived. Also for the TGV, a substitute material such as resin is temporarily filled instead of a metal material such as copper, the substitute material is removed after an active element or a wiring is formed, and then the metal material is filled.

However, in the manufacturing method, a plurality of additional processes including filling of the substitute material, flattening after that, removal of the resin, and the like have to be provided. Further, an easily removable material such as resin generally has low heat resistance, so a TFT is difficult to be formed on an upper layer thereof, or only a TFT which can be formed at a low temperature can be formed. In addition, a resin material has a higher thermal expansion coefficient than glass, so expansion and contraction are caused in a direction along the vias with the filled state maintained by heating and cooling in the process. Therefore, there is a fear that wirings formed in an upper layer thereof may be damaged.

In view of the circumstances as described above, it is desirable to reduce an influence of characteristic variation in an active element based on a metal contamination generated in the process and achieve more stable operation thereof, even if a through glass via (TGV) is formed in a glass substrate.

According to a first embodiment of the present disclosure, there is provided a method of manufacturing a wiring substrate that has a wiring including a through glass via and is formed of a glass substrate. The method includes forming an alteration layer that penetrates the wiring substrate and is patterned, forming the wiring on a front surface of the wiring substrate in which the alteration layer has been formed, and filling an electrode material in a hole formed by removing the alteration layer, thereby forming the through glass via that connects the wiring on the front surface of the wiring substrate and the wiring on a back surface side thereof.

The glass substrate may be formed of photosensitive glass in which the patterned alteration layer is capable of being formed by exposure and a heat treatment through a mask.

The glass substrate may be formed of non-photosensitive glass, and by exposure and a heat treatment through a mask, the patterned alteration layer is formed therein.

The patterned alteration layer may be formed by collected laser pulse irradiation.

The patterned alteration layer may be removed by using a chemical having selectivity with the glass.

The wiring substrate may include an active element in addition to the through glass via and the wiring.

A difference between a thermal expansion coefficient of the patterned alteration layer and a thermal expansion coefficient of a non-alteration layer other than the alteration layer may be smaller than approximately 5 ppm/° C.

A wiring substrate that is manufactured by the method of manufacturing a wiring substrate described above.

In the first embodiment of the present technology, by the method of manufacturing the wiring substrate formed of the glass substrate and having the wiring including the through glass via, the patterned alteration layer that penetrates the wiring substrate, the wiring is formed on the front surface of the wiring substrate in which the alteration layer has been formed, and the electrode material is filled in the hole formed by removing the alteration layer, thereby forming the through glass via that connects the wiring on the front surface of the wiring substrate and the wiring on the back surface side thereof.

According to a second embodiment of the present disclosure, there is provided a method of manufacturing a component-embedded glass substrate formed by combining a first glass wiring substrate and a second glass wiring substrate on which a component is mounted.

The first and second glass wiring substrates may be bonded to each other with a light curing resin.

When a resin is applied to bond the first and second glass wiring substrates by pressure, a structure for preventing expansion of an applied area, which has one of a protruded shape and a depressed shape may be formed on one of the first and second glass wiring substrates.

The first glass wiring substrate may include a through glass via for connecting upper and lower wirings and a through hole and a cavity corresponding to a size of a component to be mounted on the second glass wiring substrate.

A base material of the first and second glass wiring substrates may be photosensitive glass.

A difference between a thermal expansion coefficient of a base material of the second glass wiring substrate on which an active element chip is mounted and a thermal expansion coefficient of a material of the active element chip may be equal to or less than 10 ppm/° C.

A component mounted on the first glass wiring substrate may include entire surface-mountable components necessary for a semiconductor apparatus, a passive element, and a system structure, and include a connection portion for mounting a component incapable of being mounted on a surface.

The component-embedded glass substrate may further include an outer layer surface that forms a casing surface of an electronic apparatus.

The component-embedded glass substrate may further include an outer layer surface made of chemical strengthening glass.

A display device may be mounted toward an outer layer surface.

The component-embedded glass substrate may include, in an inner layer, a flow channel in which a refrigerant for cooling a mounted heat generation component is caused to flow.

A metal shield may be disposed around a semiconductor apparatus mounted.

The metal shield may be constituted of a metal film formed on an inside wall of a cavity in the first glass wiring substrate which surrounds the semiconductor apparatus mounted and metal corresponding to another wiring layer.

The metal shield may be constituted of metal corresponding to wiring layers above and below the semiconductor apparatus mounted and a through glass via disposed to surround a cavity in the first glass wiring substrate which covers the semiconductor apparatus.

The component-embedded glass substrate may include a lens structure in a part thereof.

A component-embedded glass substrate according to the present technology is manufactured by the method of manufacturing a component-embedded glass substrate described above.

The second embodiment of the present technology is structured by combining the first glass wiring substrate and the second glass wiring substrate on which the component is mounted.

According to the first embodiment of the present technology, when the wiring substrate is formed, even if the through glass via (TGV) is formed in the glass substrate, it is possible to reduce the influence of characteristic variation of the active element based on metal contamination generated in the process and cause the active element to more stably operate.

Further, according to the second embodiment of the present technology, it is possible to embed the components having different heights in the glass substrate at the same time.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure will be described with reference to the drawings. It should be noted that the description will be given in the following order.
1. First embodiment (example of forming through glass via with characteristic variation suppressed)
2. Second embodiment (example of forming component-embedded glass substrate)<

1. First Embodiment

<Formation of Through Glass Via with Characteristic Variation Suppressed>
<Via-First Process>

Figure 1:
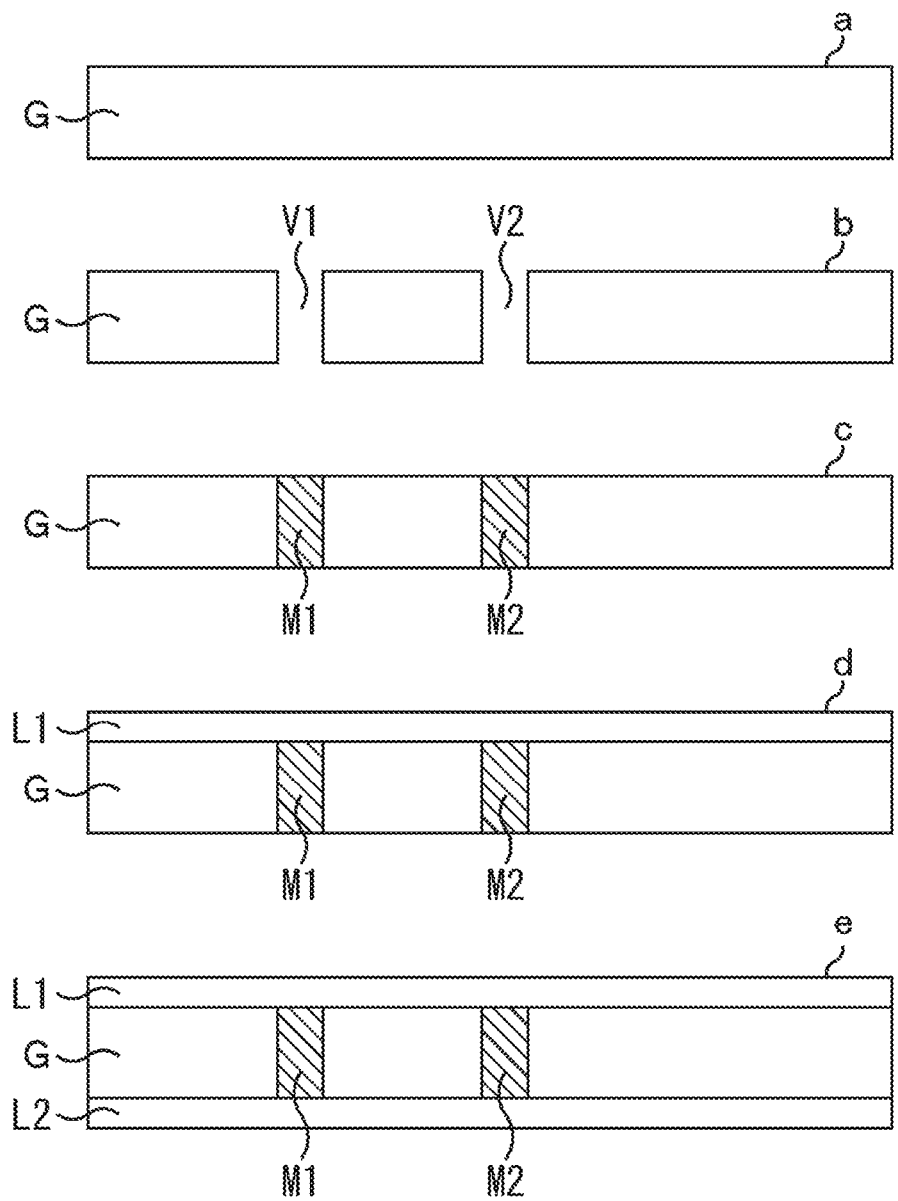
FIG. 1 is a diagram for explaining a method of manufacturing a wiring substrate including TGVs in related art.

First, with reference to FIG. 1, a description will be given on details of a method of manufacturing a glass substrate with a through glass via by a general via-first process. It should be noted that, FIG. 1 shows states a to g of a glass substrate G which correspond to processes. In the figure, diagrams are cross sections of the glass substrate G taken in a vertical direction. An upper side surface in FIG. 1 is a front surface of the glass substrate G, and a lower side surface in FIG. 1 is a back surface of the glass substrate G.

As indicated by the state a on an uppermost stage shown in FIG. 1, the glass substrate G is prepared as one glass plate first. That is, in the state a, the glass substrate has a plate shape without being subjected to any process.

Then, as indicated by a state b on a second stage from above in FIG. 1, in a first process, by focused electrical discharging, a process method of irradiating photosensitive glass with ultraviolet rays, or the like, vias v1 and v2 are formed in the glass substrate G.

Further, as indicated by a state c on a third stage in FIG. 1, in a second process, metal is filled in the vias v1 and v2, thereby forming through glass vias (TGV) M1 and M2 in the glass substrate G. In this way, by forming the through glass vias M1 and M2 with metal, in the following process, it is possible to perform processing with the substrate as one plate without the vias v1 and v2.

Subsequently, as indicated by a state d on a fourth stage in FIG. 1, in a third process, on a surface of the glass substrate G, a wiring layer L1 formed of an active element such as a transistor and a wiring is formed.

Finally, in a state e on a lowermost stage in FIG. 1, on a back surface side of the glass substrate G, a wiring layer L2 is formed, with the result that a wiring substrate is completed in which the wiring layer L1 on the front surface side of the glass substrate G and the wiring layer L2 on the back surface side thereof are electrically connected by the through glass vias M1 and M2.

Through the above processes, on the glass substrate G, the active element and the wiring layers are formed.

However, in the via-first process, the metal material used when the TGVs are formed, that is, used when the through glass vias M1 and M2 are formed becomes a contamination source that affects the characteristic variation of the active element of the wiring layer L1. As a result, there is a fear that the material may be a factor that causes a threshold voltage to vary in the case where the active element is a TFT (Thin Film Transistor), for example. Further, although the variation of the threshold voltage can be absorbed by increasing an operation voltage, the increase in the operation voltage causes an increase in power consumption. Further, in a large-scale TFT manufacture line, effective washing technology and equipment with respect to metal contamination are not generally provided, unlike an LSI manufacture line. Therefore, when a substrate is used with metal such as Cu as a base, and a TFT is formed thereon, it is very difficult to prevent contamination of the TFT.

<Wiring Substrate Manufacturing Process>

Subsequently, with reference to a flowchart of FIG. 2, a wiring substrate manufacturing process to which the present technology is applied will be described.

Figure 3:
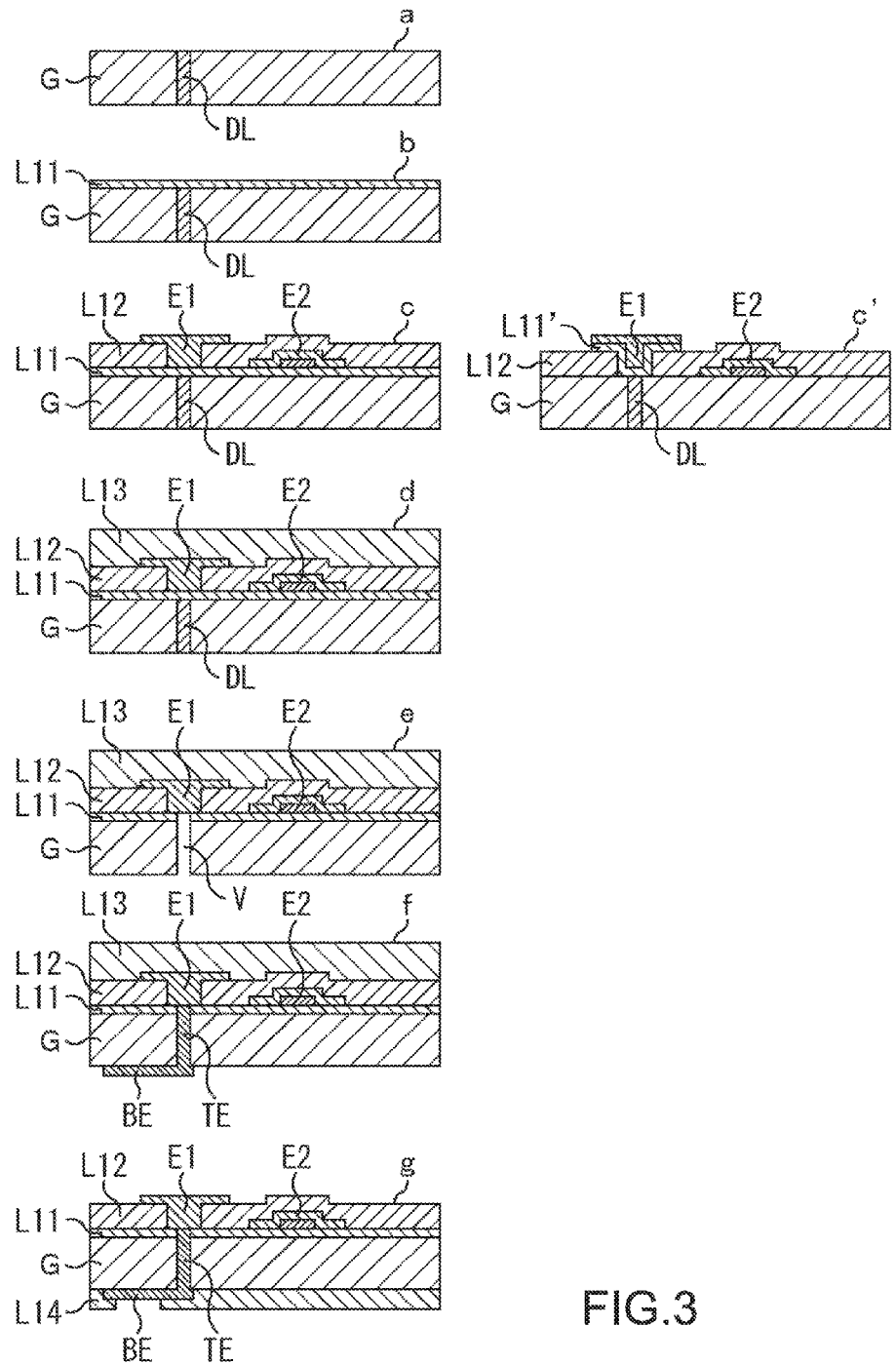
FIG. 3 is a diagram for explaining a method of manufacturing a wiring substrate according to the present technology.

In Step S11, first, as indicated by a state a on the uppermost stage in FIG. 3, substrate washing for the glass substrate G is performed, a quartz/Cr mask on which a through glass via pattern is applied is used, and a via forming portion is exposed by a light source with a wavelength of 310 nm, thereby forming an alteration layer DL in the via forming portion. The glass substrate G is made of photosensitive glass, and the alteration layer DL is formed therein by performing exposure by the light source.

Here, the photosensitive glass generally refers to glass obtained by causing $SiO_2$—$Li_2O$—$Al_2O_3$-based glass to include small amounts of Au, Ag, and Cu as photosensitive metal and $CeO_2$ as a sensitizer. The via forming portion in the glass substrate G made of the photosensitive glass is irradiated with ultraviolet rays, and metal atoms are generated by an oxidation-reaction (redox) reaction. Further, the portion is heated, thereby clumping the metal atoms together to form a colloid. Then, crystal of $Li_2O.SiO_2$ (lithium meta-silicate) is grown with the colloid as a crystal nucleus. The lithium meta-silicate is easily dissolved in HF (hydrogen fluoride). When a glass part irradiated with the UV rays and a glass part not irradiated with the UV rays are compared, there is a difference in dissolving speed by several tens of times. By using the difference in the dissolving speed, in a process to be described later, selective etching can be performed, a fine worked object such as a via is formed without using machining and can serve as the through glass via (TGV).

In Step S12, the exposed glass substrate G is subjected to a heat treatment (baking) at a temperature of approximately 500 to 600° C. in accordance with characteristics of the material. That is, through Steps S11 and S12, on the glass substrate G, a through glass via pattern formed of the alteration layer DL is formed.

In Step S13, as indicated by a state b on the second stage in FIG. 3, on a side on which the TFT is formed on the glass substrate G (upper side in the figure), an insulating film having selectivity with an HF solution is formed on an entire surface as an etching stopper layer L11 of the via opening. As etching stopper layer L11, for example, a SiN film formed by plasma CVD (Chemical Vapor Deposition) may be used, or any other films may be used as long as the film is an insulating film having selectivity with the HF solution. Further, in the case where a solution for etching the alteration layer DL is different depending on a glass material or a method, the etching stopper layer L11 is made of a material in accordance with the solution.

Further, the etching stopper layer L11 serves as a layer for protecting a wiring portion (to be described later) from the etching solution of the alteration layer DL that forms the via forming portion. Therefore, the etching stopper layer L11 does not necessarily have to be formed on the entire surface. For example, as indicated by an etching stopper layer L11' in a state c' of FIG. 3, the etching stopper layer may be provided among the alteration layer DL as the via forming portion, a wiring in contact with the alteration layer DL, and a pixel electrode E1 in a limited way. Further, in this case, the etching stopper layer L11 does not have to be an insulating film and may be a conductive material or metal which is difficult to be dissolved in the HF solution. Further, in the case where a material disposed on a bottom surface of the wiring has an etching resistance, the etching stopper layers L11 and L11' as indicated in the states b and c' of FIG. 3 are unnecessary.

In Step S14, as indicated by a state c on the third stage shown in FIG. 3, on a front surface side of the glass substrate G, the wiring, the pixel electrode E1, a TFT E2, and a protection film L12 are formed, thereby producing an array substrate. More specifically, in the case of a process of forming standard TFT layer, wiring layer, and pixel electrode, first, a metal film is evaporated, and a gate electrode and a storage capacitor electrode are formed by etching. Then, an insulating film ($SiO_2$, $SiNx$) are formed on an entire surface by CVD, and an amorphous silicon (a-Si) layer serving as a gate is successively accumulated by CVD, thereby forming the layer up to a thickness of approximately 50 nm. Subsequently, a channel protection film ($SiNx$) is formed by etching, and a phosphorus-doped semiconductor layer (n+a-Si) is formed in order to increase connectivity with the electrode and reduce a leak current. After that, a three-layer metal film (Mo—Al—Mo) is evaporated, and a drain layer and a source layer are formed by etching. Then, the protection film ($SiNx$) L12 is formed on the entire surface by CVD, and a contact hole is formed by etching. Finally, an indium titanium oxide (ITiO) film is evaporated on the entire surface by sputtering, and an unnecessary part is removed by etching, with the result that a sub-pixel electrode is formed.

In Step S15, as indicated by a state d on the fourth stage shown in FIG. 3, in order to prevent damage with respect to the wiring, the pixel electrode E1, the TFT E2, and the protection film L12 in a subsequent TGV forming process, a protection film layer L13 is bonded to the TFT forming surface side of the glass substrate G. In this case, the protection film layer L13 against the HF solution is formed. In a typical glass panel process, an end face process after cutting glass is performed by dissolving with the HF solution. A glass surface protection sheet used at this time is used as it is. Further, as the protection film layer L13, not a protection film to be bonded but a liquid resist or the like formed by coating may be used.

In Step S16, on the back surface side of the glass substrate G, a wiring, an electrode, and the like are formed. It should be noted that, the process in Step S16 is the same as the process performed for the surface of the glass substrate G, so a description thereof will be omitted. Further, in the case where there is no need to form the electrode and the like on the back surface side, further, after a metal film is formed for a via V, or when a wiring is formed on the back surface side at the same time, Step S16 is skipped, and the process is performed in Step S19 to be described later.

In Step S17, as indicated by a state e on the fifth stage shown in FIG. 3, the glass substrate G is immersed in the HF solution (for example, 10:1 dilution) with the front surface side protected by the protection film layer L13, and an exposure portion of the glass substrate G, that is, the alteration layer DL is dissolved, thereby forming the via V that penetrates the glass substrate G. It should be noted that, in the case where the back surface wiring is formed in the process of Step S16, it is necessary to form the same protection film or sheet as that on the front surface side excluding an area around the via V.

In Step S18, the etching stopper layer L11 serving as the etching protection film (SiN in this embodiment) on the bottom portion of the via V is removed by etching, and a contact with the wiring drawn out to the back surface is opened.

It should be noted that, the etching method may be wet etching or dry etching, but anisotropic dry etching is desirable in a viewpoint of a coverage form at a time when the metal film is formed for the via V thereafter.

In Step S19, as indicated by a state f on the sixth stage shown in FIG. 3, metal is filled in the via V, a through glass via TE as a draw-out wiring and a back-surface wiring BE of the glass substrate G are formed of the metal film. Specifically, for this process, formation of a seed layer by a sputtering method and formation of a Cu film by electrolytic plating thereafter may be used. Further, before Cu plating, a wiring pattern on the back surface side may be formed by dry film resist, and semi-additive wiring may be formed by pattern plating at the same time. Of course, the through glass via TE and the back-surface wiring BE may be formed individually. Further, the method of forming the metal film for the through glass via TE is not limited to the method described above. For example, a method of performing direct draw-out with a sputtering film serving as a material of the back-surface wiring, or a method of filling and sintering or the like of conductive paste in which metal nanoparticles are dispersed may be used. Further, the order of forming the through glass via TE and the back-surface wiring BE is not unique. For example, in the process of Step S16, the back-surface wiring BE is formed first, and the metal to be filled in the via V may be used for the connection with the back-surface wiring BE.

In Step S20, as indicated by a state g on the lowermost stage shown in FIG. 3, an insulating layer L14 serving as a passivation film is formed on the back surface side, a connection pad is opened, and the protection film layer L13 on the front surface side is peeled off.

The array substrate for an LCD which is manufactured through the above processes is bonded to a color filter substrate separately manufactured, crystal injection and sealing are performed, and then an LDC panel is completed. On the LDC panel, it is possible to form a draw-out wiring on the back surface side. Therefore, for example, on a larger support substrate on which wirings are formed, the panels are arranged in a tile fashion, with the result that it is possible to form a large-sized panel having such a size as to be handled in a panel manufacturing infrastructure or larger.

It should be noted that, in the above, the example in which the photosensitive glass is used for the glass substrate G is described. However, with respect to non-photosensitive glass, by using a laser, as in the case of using the photosensitive glass, a difference in dissolving speed is caused, and an alteration portion which is dissolvable in a chemical as described above may be formed (see, for example, Japanese Patent Application Laid-open No. 2011-037707). In the case where the non-photosensitive glass is used, laser pulses using harmonic such as a YAG laser are collected, and a part where a through glass via has to be formed on a non-photosensitive glass substrate is irradiated therewith, thereby forming an alteration layer. Then, the alteration layer formed is removed by etching with the use of a solution such as HF, $H_2SO_4$, and $HNO_3$, with the result that an opening portion is formed. In the opening portion, metal is filled, thereby forming the through glass via.

<Example of Application to Organic EL Display Panel>

In the above, the example of the array substrate for LCD is described, but the present technology can be applied to other substrates including an organic EL (Electro Luminescence) display panel, as long as a glass substrate is used.

Figure 4:
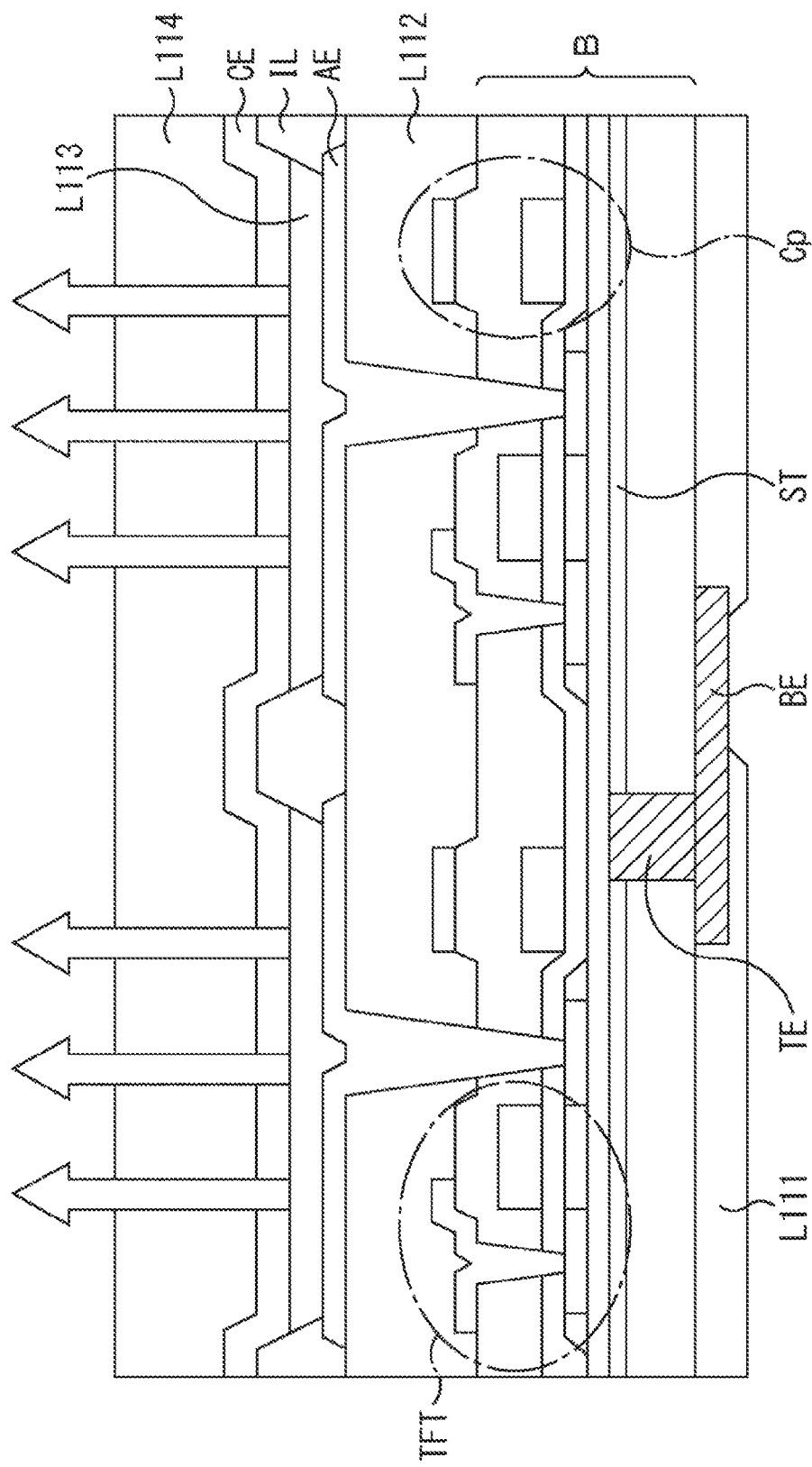
FIG. 4 is a diagram for explaining an example of a substrate for an organic EL.

More specifically, the present technology can be applied to an organic EL display panel as shown in FIG. 4.

FIG. 4 is a diagram showing the structure of a substrate in an active matrix type organic EL display panel. As shown in FIG. 4, the active matrix type organic EL display panel is constituted of a substrate B having TFTs and storage capacitors Cp, a flattening layer L112 formed on the substrate B, an anode electrode AE formed on the flattening layer L112 so as to be connected to the TFT, an insulating layer IL for separating pixels, an organic light emission layer L113 formed on the anode electrode AE, a cathode electrode CE formed on the organic light emission layer L113, and a protection layer L114 formed on the cathode electrode CE.

In FIG. 4, photosensitive glass is used for the glass substrate B. In an area where the through glass via TE is formed, an alteration layer dissolvable in the HF solution by exposure and a heat treatment is formed, through the same processes as Steps S11 and S12 in FIG. 2.

Subsequently, through the same process as Step S13 in FIG. 2, an insulating film having selectivity with the HF solution is formed entirely on a front surface (surface on which the TFT is formed) of the glass substrate B, as an etching stopper ST for a via opening. The etching stopper ST does not necessarily have to be formed on the entire surface and only has to be formed on the via forming portion, like the state c' shown in FIG. 3.

Figure 2:
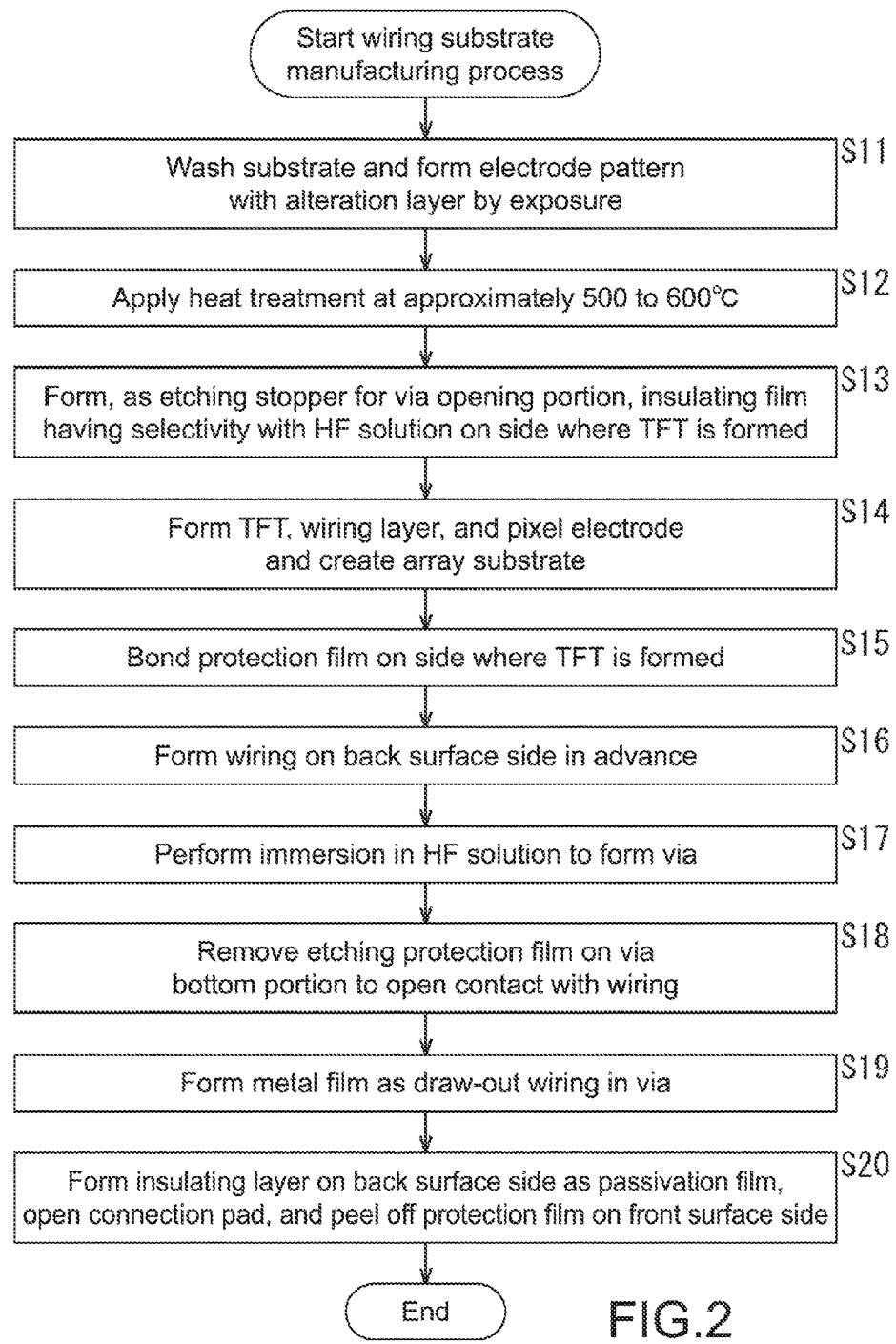
FIG. 2 is a flowchart for explaining a method of manufacturing a wiring substrate according to the present technology.

Then, through the same process as Step S14 in FIG. 2, the TFT and the storage capacitor Cp are formed, and the flattening layer L112 is formed thereon.

Further, through the same process as Step S15 in FIG. 2, at a time when the through glass via TE is formed, a protection film (not shown) against the HF solution is bonded onto the flattening layer L112.

Further, through the same process as Step S17, the alteration layer generated by HF immersion is removed. Through the same process as Step S18, a contact hole is formed in the etching stopper layer ST by dry etching. Through the same process as Step S19, the through glass via TE and the back-surface wiring BE are formed.

Then, through the same process as Step S20, a passivation film L111 on the back surface side is formed, a wiring draw-out portion is opened, and the protection film on the flattening layer L112 is peeled off.

Then, by photolithography and etching, the flattening layer L112 and the insulating layer thereunder are selectively removed. At this time, a contact hole where a drain region of the TFT is exposed is formed.

Then, through the contact hole, the anode electrode AE is formed. The anode electrode AE is used as a reflection layer of top emission type. Subsequently, on the anode electrode AE, the insulating layer IL for separating the pixels and the organic light emission layer L113 are formed. On those, the cathode electrode CE is formed, and finally, the protection layer L114 is formed on the cathode electrode CE.

In the organic EL display panel completed in this way, the draw-out wiring is formed on the back surface side thereof. Therefore, as in the case of the substrate for an LCD display described above, by arranging the panels on the support substrate in a tile fashion in parallel to connect the panels with each other, it is possible to form a large-sized panel.

In particular, for an organic EL panel, in which uniform element characteristics are difficult to be secured in a large area, the tiled panel is set to have a small area, thereby making it possible to achieve high-yield manufacture. Thus, it is possible to achieve a large-sized application, in addition to the display.

As described above, according to the present technology, the active element such as the TFT is formed, and then the metal material is filled in the through glass via portions. Therefore, it is possible to suppress the characteristic variation of the active element due to the metal material as the contamination source.

Further, by the manufacturing method according to the present technology, the alteration layer formed to open the through glass via is used as it is. Therefore, it is possible to form the through glass via without providing an additional process of filling another material instead of the metal material.

Further, the alteration layer formed in the through glass via forming portion is formed at a sufficiently higher temperature than a temperature at which the active element is formed. Therefore, a thermal expansion coefficient thereof is approximately the same as that of the non-alteration portion. Thus, through the process in which the active element and the wiring are formed, the through glass via forming portion and a peripheral portion thereof can typically ensure flatness with respect to thermal expansion and contraction (difference in the thermal expansion coefficients between the patterned alteration layer and the non-alteration layer other than that area is 5 ppm/° C. or less, desirably, 2 ppm/° C. or less). Thus, it is possible to maintain a yield equivalent to that in the case of forming the element on a past substrate on which the through glass via is not formed.

2. Second Embodiment

<Formation of Component-Embedded Glass Substrate>

In the above, the description is given on the example of forming the through glass via with the characteristic variation suppressed. By applying the technology of forming the through glass via, a component-embedded glass substrate may be formed in which a cavity or a large through hole is formed on a glass substrate, a component including a large-sized apparatus, an apparatus with no heat resistance, or the like is embedded in the glass substrate.

That is, in recent years, electronic apparatuses, in particular, mobile apparatuses are being increasingly reduced in size and thickness, while higher performance and multifunctionality of components provided thereto are advanced. Further, as an electronic apparatus which is attached to a body at all times, a wearable apparatus is also proposed. A demand for mounting, such as an extremely thin casing, a bending casing, and a microminiature casing is further increased.

To achieve an extremely thin electronic apparatus, a height of a component on so-called a mother board is one rate-limiting factor. As one means for overcoming this, unitization of a "component-embedded substrate" is given. A component-embedded glass substrate is a substrate obtained by embedding active components and passive components, which are mounted on a surface thereof in related art, in the substrate. Originally, the focus is an effect of reducing a substrate area, and the substrate has been used for a module substrate or the like in a mobile apparatus for which downsizing is important. If this technology can be applied to an entire system substrate, a component having a thickness is embedded in a substrate, thereby making it possible to suppress an entire thickness of a mother board after a component is finally provided thereto. As a result, achievement of an extremely thin casing is expected.

Component-embedded substrates are being developed and commercialized by some substrate makers, and being general in a region of high-performance module substrate or the like capable of absorbing the additional cost.

For example, the following substrate has been proposed. With the use of a B2it (Embedded Buried Bump Interconnection Technology/embedded B square it) substrate in which a silver paste bump formed on copper foil and copper foil of an opposed substrate are bonded through a prepreg, a through hole for disposing a component is formed in a part of an embedded substrate, and in the through hole, a passive component or active component package is embedded (Yoshitaka Fukuoka, et al., "Development of passive element embedded build-up wiring board "B2it"", Journal of The Japan Institute of Electronics Packaging, pp. 622-629, Vol. 5, No. 7, 2002).

In addition, an EOMIN (Embedded Organic Module Involved Nanotechnology) substrate having the following structure has been proposed. With the use of two pieces of copper foil bonded to each other with resin as a core layer, a through hole is opened in advance in the upper copper foil layer by etching, thereby forming a cavity after bonding. In the cavity, a component is provided and embedded in the substrate (Masashi Miyazaki, et al., "Development of embedded organic module technology", Journal of The Japan Institute of Electronics Packaging, pp. 298-304, Vol. 10, No. 4, 2007).

However, in the component-embedded substrate in related art, components which can be embedded are limited to a chip passive component, a packaged active element, and the like, and other components necessary for the entire structure of an electronic apparatus have to be embedded separately. Examples of the components which have to be embedded separately include a component that is weak against heat, such as a battery, a component for which a substrate has to have permeability, such as a display, a light emitting and reception element, and a relatively large-sized active element (IC) such as a bare chip.

That is, for the component-embedded substrate, thermocompression bonding is used to bond the substrates through a prepreg, so it may be impossible to embed a component weak against heat, which is difficult to stand a heat history at approximately 170° C., in the substrate. For example, in a lithium ion battery as a general power supply for a mobile apparatus, a flammable organic electrolyte is used, and study and development to achieve entire solidification is still being conducted.

Further, generally, a substrate material used for the component-embedded substrate is not transparent or translucent. Therefore, even if a display module or a light-emitting element for which inside of the substrate has to have permeability is incorporated, it may be impossible to exert functions as a display and a display element.

However, as described above, in the case where an extremely thin electronic apparatus is achieved, in a casing structure in which a display panel and a mother board are superposed as separate substrates, there is a limitation on reduction of the thickness of the casing.

Furthermore, for an organic resin wiring substrate including the component-embedded substrate, generally, there is a limitation on miniaturization of a wiring and a via hole. Therefore, when an IC chip having a fine wiring pattern is mounted, generally, mounting is generally performed as a package through an interposer or the like as a relay substrate, and for a relatively large-sized active element (IC), there is a limitation on mounting of a bare chip or the like of a flip-chip type, which achieve area saving and low height.

That is, these days, for a small-sized IC chip with a small I/O (input/output) count, a pitch of a wiring connection pad on the IC side is eased to directly mount a bare chip on a wiring substrate, for example. However, in the component-embedded glass substrate described above in which glass epoxy or copper are used as a core, there is a limitation on a size of the IC chip that can be mounted in terms of mismatch of the wiring pitch and mismatch of a thermal expansion coefficient.

Due to the limitations as described above, in the component-embedded substrate technology in related art, it may be impossible to embed all the components that constitute the electronic apparatus, and the electronic apparatus is constituted of a mother board and a module substrate in which components are embedded, other components and modules such as a battery and a display, a casing including those, and the like, and therefore there is a limitation on the reduction in thickness thereof.

<Basic Structure of Component-Embedded Glass Substrate>

Figure 5:
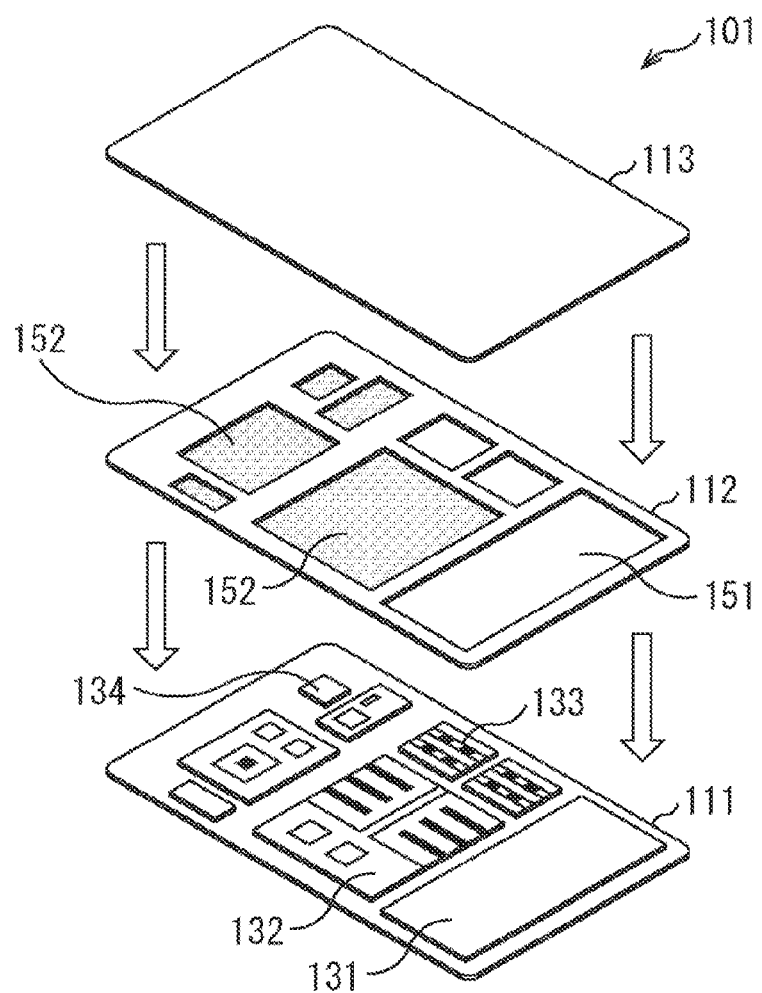
FIG. 5 is a diagram for explaining the structure of a component-embedded glass substrate according to a second embodiment.
Figure 5:
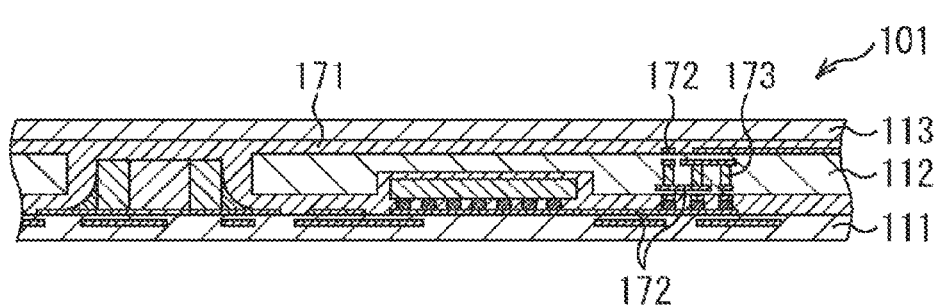

A component-embedded glass substrate to which the present technology is applied has the structure as shown in FIG. 5, for example. It should be noted that, on an upper part of FIG. 5, an exploded view of a component-embedded glass substrate 101 is shown, and on a lower part of the figure, a side-surface cross-sectional view of the component-embedded glass substrate 101 is shown.

The component-embedded glass substrate 101 shown in FIG. 5 is constituted of a component mounted substrate 111, a wiring substrate 112, and a cover glass 113.

On the component mounted substrate 111, various components such as a battery 131, an IC (bare chip) 132, a passive component 133, and a sensor 134 are mounted. In the wiring substrate 112, a through glass via 173, a cavity 152, and a through hole 151 are formed. The component mounted substrate 111 and the wiring substrate 112 are bonded with each other with a UV (Ultra Violet) curable resin 171 used as an adhesive. Further, the cover glass 113 is bonded onto the wiring substrate 112 with the UV curable resin 171 as an outer cover of the component mounted substrate 111 and the wiring substrate 112 bonded to each other.

In the wiring substrate 112, the cavity 152 and a through hole 151 corresponding to the height of a component mounted on the component mounted substrate 111 are formed.

As shown in the lower part of FIG. 5, in each of the component mounted substrate 111, the wiring substrate 112, and the cover glass 113, a multilayer wiring 172 formed of one or more wiring layers is formed. Low components such as an IC to be embedded in the cavity 152 are mounted on the component mounted substrate 111 before bonding the substrates. Therefore, there is no need to consider an influence of a heat load, and a general mounting method such as bonding of solders, Au—Sn (gold-tin) bonding by using Au (gold) stud bump, ACF/ACP (Anisotropic Conductive Film/Paste), and NCF/NCP (Non Conductive Film/Paste) may be used. Further, when the substrates are bonded, for a connection part where electronic conduction between the substrates is obtained, if a component weak against heat is already mounted thereon, a bonding method involving a low heat load may be used. For example, a UV curable resin (UV-curable anisotropically conductive adhesive) or the like may be used as an adhesive. Further, in the case where the component weak against heat is mounted later, another bonding method involving the high heat load described above may be used. It should be noted that the wiring substrate 112 is also provided with a connection unit (not shown) for connecting components incapable of being mounted on the surface, in addition to all the surface mountable components necessary for the system configuration, the semiconductor apparatus such as the IC, and the passive element.

<Process of Manufacturing Component-Embedded Glass Substrate>

Figure 6:
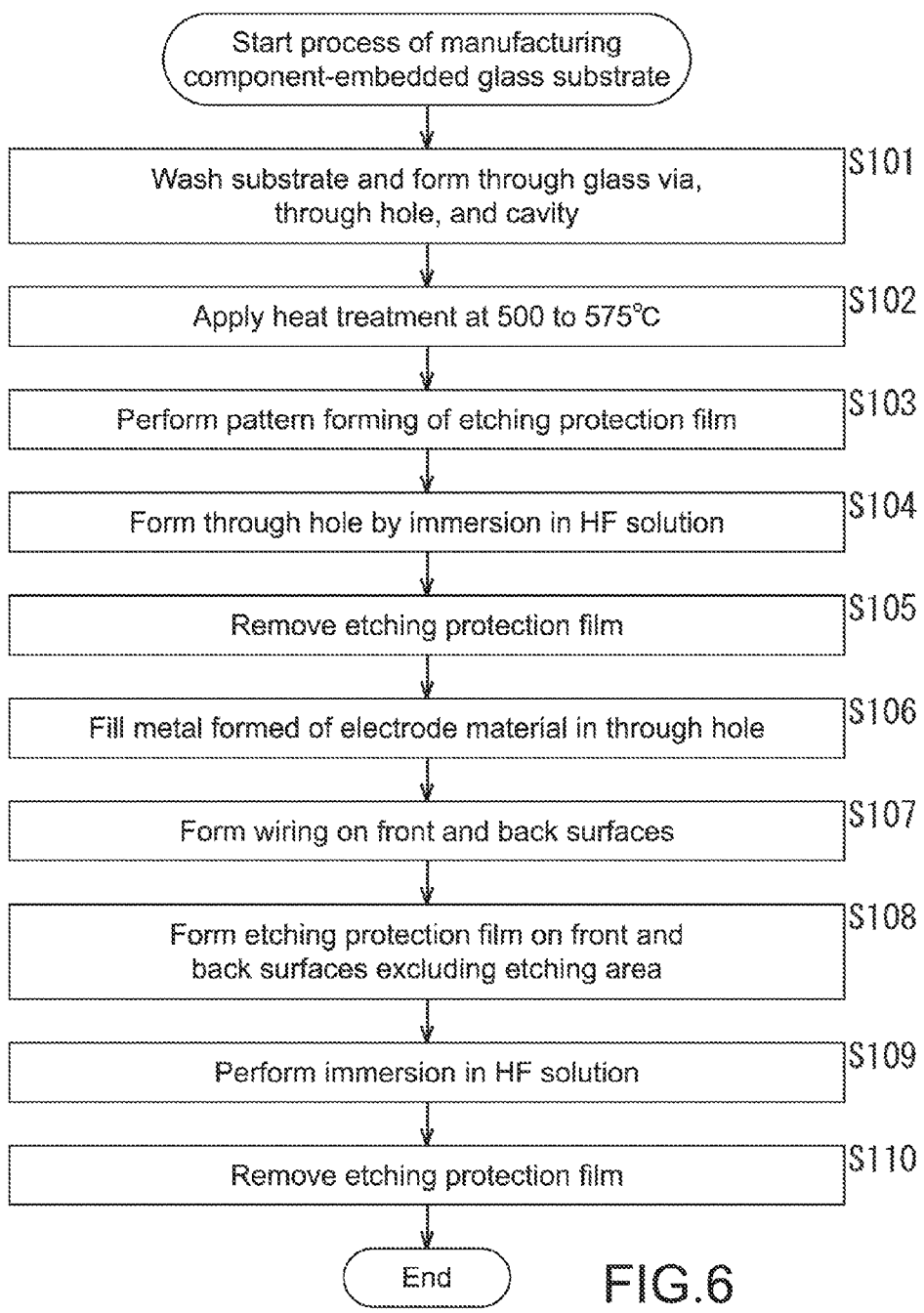
FIG. 6 is a flowchart for explaining a method of manufacturing a wiring substrate formed of the component-embedded glass substrate shown in FIG. 5 according to the present technology.

Subsequently, with reference to a flowchart shown in FIG. 6, a description will be given on a process of manufacturing the component-embedded glass substrate in which the through hole 151, the cavity 152, and the through glass via 173 are formed.

It should be noted that herein, an example of using photosensitive glass as a base material will be described. The photosensitive glass refers to glass obtained by causing $SiO_2$—$Li_2O$—$Al_2O_3$-based glass to include small amounts of Au, Ag, and Cu as photosensitive metal and $CeO_2$ as a sensitizer. The glass is irradiated with ultraviolet rays, and metal atoms are generated by an oxidation-reaction (redox) reaction. Further, the glass is heated, thereby clumping the metal atoms together to form a colloid. Then, crystal of $Li_2O.SiO_2$ (lithium meta-silicate) is grown with the colloid as a crystal nucleus. The lithium meta-silicate is easily dissolved in HF (hydrogen fluoride). When the part and a glass part not irradiated with the UV rays are compared, there is a difference in dissolving speed by approximately 50 times. By using the difference in the dissolving speed, selective etching can be performed, and a fine via for a through glass via, a large-area penetrated opening portion and cavity for mounting a component therein, or the like can be formed at the same time without using machining.

Figure 7:
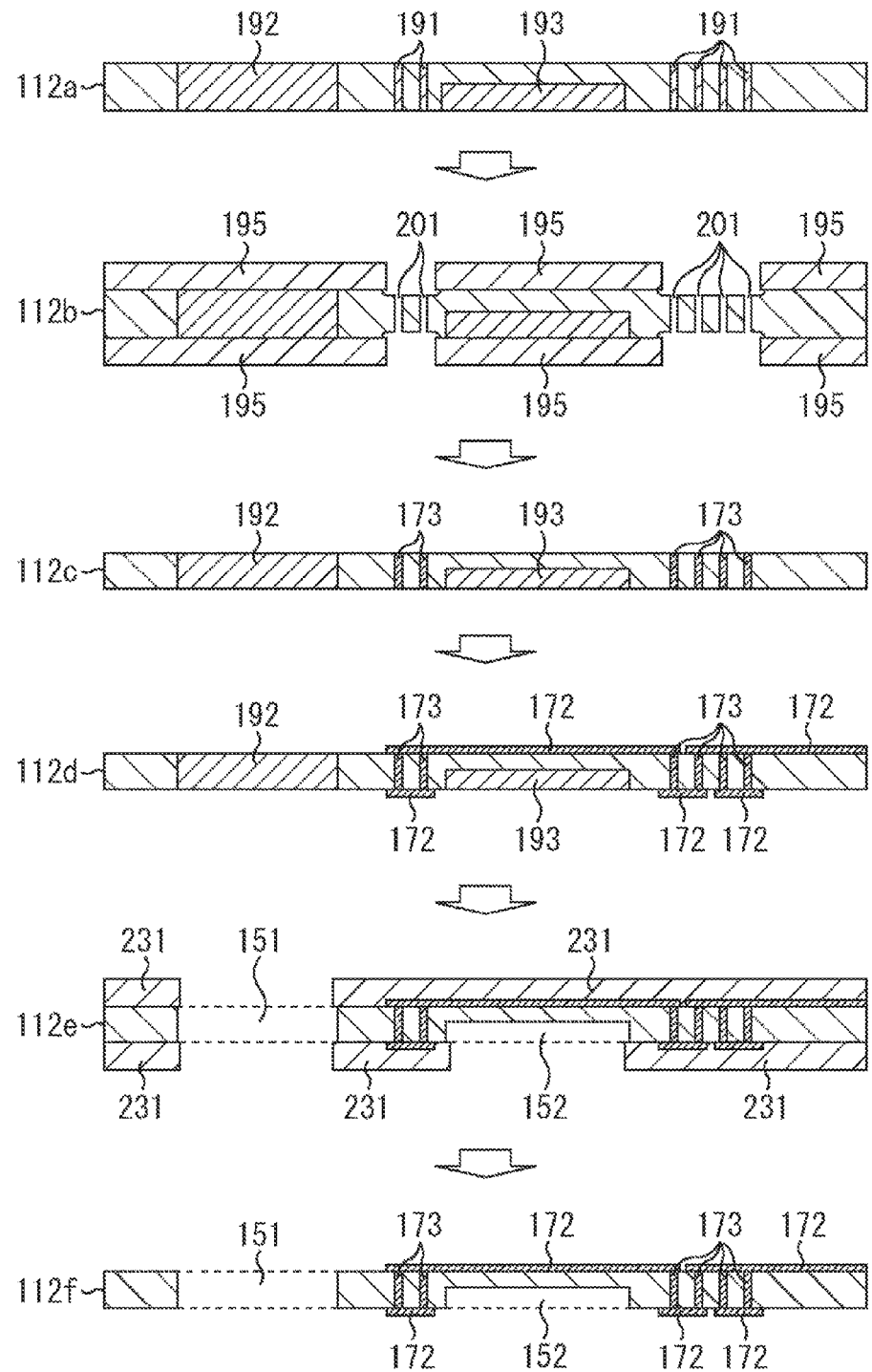
FIG. 7 is a diagram for explaining the method of manufacturing the wiring substrate formed of the component-embedded glass substrate shown in FIG. 5.

That is, in Step S101, after a substrate is washed, for example, as indicated by a wiring substrate 112a on the uppermost stage shown in FIG. 7, a quartz/Cr mask on which plane patterns of a via area 191 for the through glass via, a through hole area 192 for mounting a component therein, and a cavity area 193 are formed is used, and to form the through hole area 192, with a light source with a wavelength of 310 nm, exposure is performed with ultraviolet light.

In Step S102, a heat treatment at approximately 500° C. to 600° C. is applied, thereby forming an area which has a high solubility with respect to the HF. For the areas of the via area 191 for the through glass via, the through hole area 192 for mounting the components therein, and the cavity area 193, masks are additionally prepared, and exposure may be performed under individual conditions. However, by using so-called a halftone mask with a Cr pattern of the cavity area 193 as halftone, the exposure may be performed at the same time. In this case, it is possible to adjust an exposure depth by a Cr transmittance of the pattern area exclusively for the cavity area 193, so the cavity areas 193 having different depths can be formed.

In Step S103, as indicated by a wiring substrate 112b shown in FIG. 7, a protection film (etching protection film) 195 for protecting an area excluding the via area 191 for the through glass via from the HF etching is patterned on a surface of the wiring substrate 112.

As the protection film 195, photosensitive resin such as resist can be simply used, but an inorganic film having a high selectivity with respect to the HF, such as SiN, may be used. In the case of using the SiN film, patterning is performed by dry etching with $CF_4/O_2$-based gas or by wet etching with heated $H_3PO_4$.

After the protection film 195 is formed, in Step S104, the wiring substrate 112 is immersed in 10:1 HF solution. As a result, the exposure portion is dissolved, thereby opening a via 201 for the through glass via. At this time, in the case where alignment accuracy of the pattern of the protection film 195 and the pattern of the via 201 is not obtained (the case of fine via patterns for example), it is necessary to open the pattern of the protection film 195 so as to be broader than the pattern of the via 201. In this case, at the time of immersion in the HF solution, non-exposure glass in the opening area in the protection film 195 is also etched, so a step is slightly formed as indicated by the wiring substrate 112b shown in FIG. 7. However, the step can be mostly or completely eliminated by polishing in a subsequent metalizing process. Of course, when the step is not a problem with respect to a wiring process thereabove, the step may be left as it is. If the opening pattern of the protection film 195 coincides with the via 201 for the through glass via, this problem does not arise.

In Step S105, the protection film 195 is removed.

In Step S106, as indicated by a wiring substrate 112c shown in FIG. 7, so-called a metalizing process is performed in which metal as an electrode material is filled in the opened via 201, thereby forming the through glass via 173. For example, a metal film may be filled by forming a seed layer by sputtering and forming a Cu film by electrolytic plating thereafter. Further, copper plating film may be formed so as to entirely fill the via 201, and after that, the Cu plating film and the seed layer on the surface may be removed by CMP (Chemical Mechanical Polishing). At this time, as indicated by the wiring substrate 112b shown in FIG. 7, when the step is generated in the opening portion of the protection film 195, as indicated by the wiring substrate 112c shown in FIG. 7, by performing finishing polishing with a use of a CMP slurry for a $SiO_2$ film, the step may be eliminated. Further, the metal for the through glass via 173 is not limited the metal described above. For example, the Cu plating film and a metal sputtering film for wiring are grown in a conformal manner in the via 201, the metal film formed on the front and back surfaces of the wiring substrate 112 may be processed directly and used as a first-layer wiring on the front and back surfaces, and for example, by filling and sintering conductive paste in which metal nanoparticles are dispersed, the through glass via 173 may be formed.

In Step S107, as indicated by the wiring substrate 112d shown in FIG. 7, with respect to the front and back surfaces of the wiring substrate 112, a multilayer wiring 172 which is constituted of one or more wiring layers is formed. It should be noted that the multilayer wiring 172 only has to form and process a metal film in the case of one-layer wiring on each of the front and back surfaces. However, in the case of a multilayer wiring (two or more layers), an inorganic or organic-based interlayer insulating film is inserted, and the via 201 for connecting upper and lower wirings and the through hole 151 and cavity 152 in the substrate, which are to be opened in a subsequent process, are opened. At this time, the through hole 151 and the cavity 152 for mounting the components therein are exposed but not processed, and thus can be handled as a substrate with no unevenness during a wiring formation process. Therefore, it is possible to use infrastructure of a wiring process in a wafer line and a backplane process in a panel line.

In Step S108, as indicated by the wiring substrate 112e shown in FIG. 7, a protection film (etching protection film) 231 is formed on the front and back surfaces of the wiring substrate 112 by patterning excluding the through hole area 192 and the cavity area 193.

In Step S109, when the wiring substrate 112 is immersed in the 10:1 HF solution, as indicated by the wiring substrate 112e shown in FIG. 7, the cavity area 193 and the through hole area 192 for storing the components mounted on the component mounted substrate 111 are etched, thereby forming the through hole 151 and the cavity 152.

In Step S110, as indicated by a wiring substrate 112f shown in FIG. 7, the protection film 231 is removed, and the wiring substrate 112 is finally completed in which the through glass via 173, the through hole 151 for mounting the component, and the cavity 152 are formed. It should be noted that, in the case where solder or the like is used for connection with another substrate, a barrier film such as electroless Ni/Au plating may be formed for a connection pad portion.

It should be noted that the wiring substrate 112 can be manufactured without using the photosensitive glass. In a glass substrate having a through glass via formed by another processing method such as mechanical drilling and sand blast, wiring is formed, and a through hole for mounting a component and a cavity may be additionally processed finally.

However, the additional processing involves increasing in number of and kinds of processes, and decreasing in intensity due to micro clacks on a glass processed surface in the case of mechanical machining. Therefore, in consideration of design change or development to multiple types, an unacceptable cost increase may be caused. In view of this, in actuality, it is desirable that the photosensitive glass described in this embodiment is used.

Further, the wiring substrate 112 obtained as described above is used as the wiring substrate 112 as shown in the side-surface cross-sectional view on the lower part of FIG. 5. Also, the wiring of the component mounted substrate 111 may be manufactured by the same process, and when necessary, a cavity or the like may be formed.

Further, in the above, the example in which the photosensitive glass is used for the wiring substrate 112 is given. By using a laser with respect to non-photosensitive glass, a difference in dissolving speed is caused as in the case of using the photosensitive glass, and an alteration portion dissolvable in a solution may be formed as described above (see, for example, Japanese Patent Application Laid-open No. 2011-037707). In the case where the non-photosensitive glass is used, laser pulses using harmonic such as a YAG laser are collected, and a part for which a through glass via has to be formed on the wiring substrate 112 formed of the non-photosensitive glass substrate is irradiated with the laser, thereby forming the alteration layer. Then, the formed alteration layer is removed by etching with a solution such as HF, $H_2SO_4$, and $HNO_3$, thereby forming an opening portion. Metal is filled in the opening portion, thereby forming a through glass via.

<Method of Laminating Substrate>

Subsequently, a description will be given on a method of laminating the substrates by using light curing resin. In the present technology, UV curing resin is used as an adhesive. When the wiring substrate 112 and the component mounted substrate 111 are bonded to each other, there is a case where a passive component 133 which has to be out of contact with the adhesive, such as a MEMS (Micro Electro Mechanical Systems) element chip having a movable portion may be mounted.

In the present technology, various cavities 152 can be collectively processed with respect to the wiring substrate 112. In view of this, as shown in FIG. 8, in order not to cause an adhesive 252 to infiltrate into an area where a mounted component such as an IC 132 (including a passive component 133 and a sensor 134 (not shown)) on the component mounted substrate 111 is mounted, around the area where the mounted component is mounted, a dam 251 having a protruded shape or a groove 261 having a depressed shape are formed.

Figure 8:
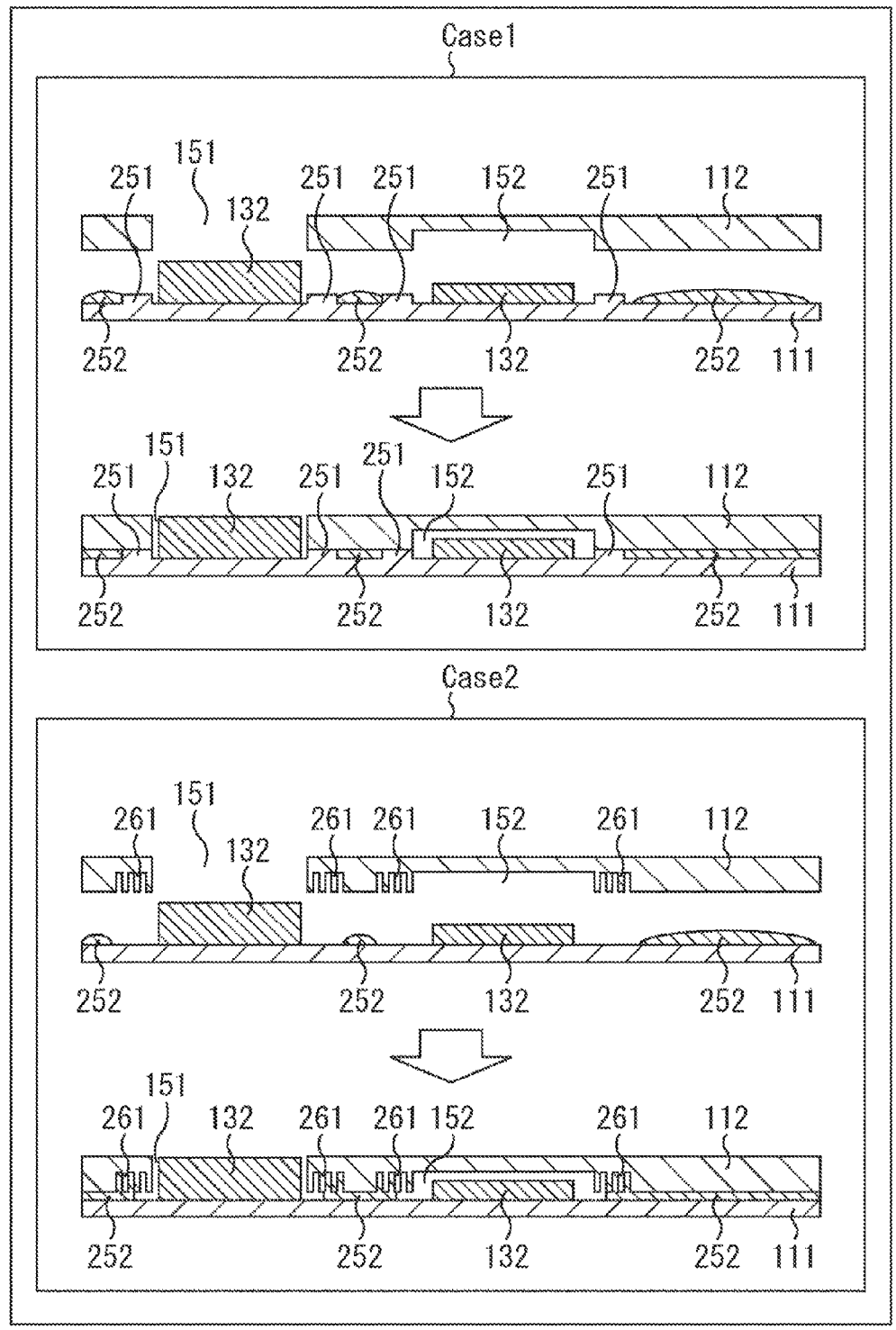
FIG. 8 is a diagram for explaining the structure for preventing an adhesive from infiltrating into an area where a component is mounted when a component mounted substrate and the wiring substrate are laminated and bonded to each other.

That is, as indicated by an upper part of Case 1 shown in FIG. 8, an example is given in which the protruded dam 251 is provided so as to surround the area where the mounted component such as the IC 132 (including the passive component 133 and the sensor 134 (not shown)) on the component mounted substrate 111 is mounted. With this structure, the adhesive 252 is prevented from infiltrating into the area where the IC 132 is provided over the dam 251. Further, as indicated by a lower part of Case 1 shown in FIG. 8, even if the component mounted substrate 111 and the wiring substrate 112 are bonded to each other with the adhesive 252, the adhesive 252 is prevented from infiltrating into the area where the components such as the IC 132 are mounted by the dam 251.

Similarly, as indicated by an upper part of Case 2 shown in FIG. 8, an example is given in which the depressed groove 261 is provided so as to surround the area where the mounted component such as the IC 132 (including the passive component 133 and the sensor 134 (not shown)) on the component mounted substrate 111 is mounted. With this structure, the adhesive 252 is prevented from infiltrating into the area where the IC 132 is provided, although the adhesive soaks and spreads along the groove 261. Further, as indicated by a lower part of Case 2 shown in FIG. 8, even if the component mounted substrate 111 and the wiring substrate 112 are bonded to each other with the adhesive 252, the adhesive 252 is prevented from infiltrating into the area where the components such as the IC 132 are mounted by the groove 261.

<Laminating Process>

Figure 9:
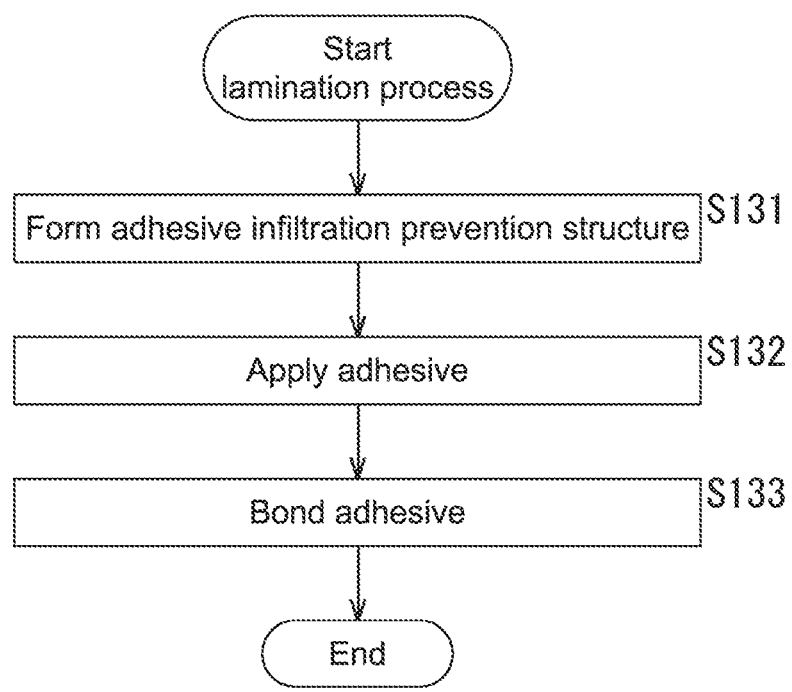
FIG. 9 is a flowchart for explaining a laminating process of the component mounted substrate and the wiring substrate.

Subsequently, with reference to a flowchart shown in FIG. 9, a laminating process will be described.

In Step S131, on the component mounted substrate 111, a infiltration prevention structure for the adhesive 252, for example, the protruded dam 251 or the depressed groove 261 is formed.

In Step S132, the adhesive 252 made of the UV curing resin or the like is applied to an area on the component mounted substrate 111, on which the component is not mounted and which is surrounded by the infiltration prevention structure.

In Step S133, the component mounted substrate 111 and the wiring substrate 112 are bonded to each other.

Through the above processes, the adhesive 252 made of the UV curing resin, which is applied before the component mounted substrate 111 and the wiring substrate 112 are bonded soaks and spreads along the surface of the substrate when being pressed by pressure, but does not soak and spread therebeyond by the protruded dam 251 or the depressed groove 261. As a result, in the component-embedded glass substrate 101 according to the present technology, even the components that have to be out of contact with the adhesive 252, such as the IC 132, the passive component 133, the sensor 134, and the MEMS element chip provided with the movable portion can be embedded. It should be noted that the infiltration prevention structure as described above may be provided to both or either of the component mounted substrate 111 and the wiring substrate 112. Further, the dam 251 and the groove 261 as the infiltration prevention structure for the adhesive may be produced at the same time when the cavity 152 is formed.

<Embedment of Cooling Structure>

In the present technology, when the through hole 151 and the cavity 152 are opened in wiring substrate 112, various shapes can be formed at the same time. Therefore, a structure having another purpose may be formed. For example, a micro flow channel for cooling the component may be embedded in the substrate.

Figure 10:
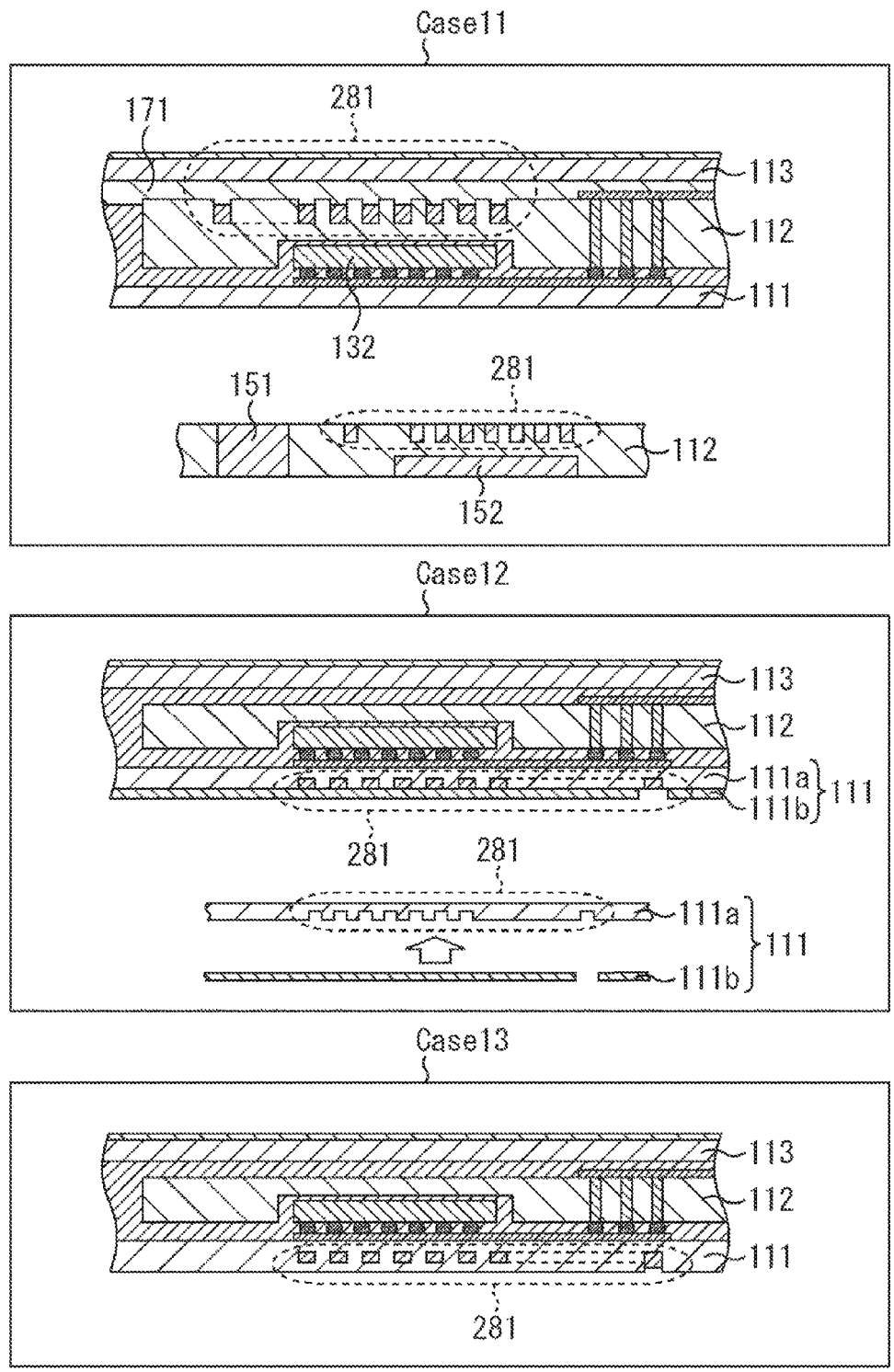
FIG. 10 is a diagram for explaining an example in which a flow channel for cooling is formed inside.

For example, as indicated by an upper part of Case 11 shown in FIG. 10, in the wiring substrate 112, a micro flow channel 281 may be formed. That is, as indicated by a lower part of Case 11 shown in FIG. 10, when photosensitive glass is exposed to light, a pattern of the micro flow channel 281 is included in a mask, and a groove of the micro flow channel 281 is also processed at the same time when the through hole 151 and the cavity 152 are formed. When the wiring substrate 112 in which the micro flow channel 281 is formed in this way is bonded with the cover glass 113, as indicated by the upper part of Case 11 shown in FIG. 10, an adhesive (UV curing resin) 171 made of resin having high moisture resistance is used, thereby sealing the flow channel, and the micro flow channel 281 is finally formed.

In addition, as indicated by an upper part of Case 12 shown in FIG. 10, on the side of the component mounted substrate 111, the micro flow channel 281 may be formed in advance. For example, as indicated by a lower part of Case 12 shown in FIG. 10, the component mounted substrate 111 is constituted of two substrates 111*a* and 111*b*. On the substrate 111*a*, the groove of the micro flow channel 281 is formed, and as indicated by the upper part of Case 12 shown in FIG. 10, the substrate 111*a* and the substrate 111*b* made of glass are bonded to each other, thereby forming the micro flow channel 281.

It should be noted that, the bonding of the substrates 111*a* and 111*b* may be performed with resin. However, in consideration of a heat history or the like in a wiring process or a component reflow mounting, a bonding method with higher heat resistance is desirable. At this time, the processed glass substrates are just bonded, and there is no restriction of a heat load. Therefore, for example, a bonding method such as anodic bonding, for which high temperature is necessary may be used.

Further, as indicated by Case 13 shown in FIG. 10, by a femtosecond laser, irradiated glass is reformed and edged, and thus the micro flow channel 281 may be formed.

In the micro flow channel 281 formed as described, a refrigerant is enclosed, and a micro pump or the like is mounted on the component-embedded glass substrate 101 according to the present technology, with the result that it is possible to embed a component cooling mechanism in the component-embedded glass substrate 101. In the present technology, the UV curing resin with no heat load at the time of bonding the substrates is used, so it is possible to laminate the substrates with such a mechanism embedded therein.

<Embedment of Shield Structure>

In the component-embedded glass substrate 101 according to the present technology, the wiring, the through glass via, the cavity, and the like are used, thereby making it possible to form an electromagnetic shield structure (metal shield structure).

Figure 11:
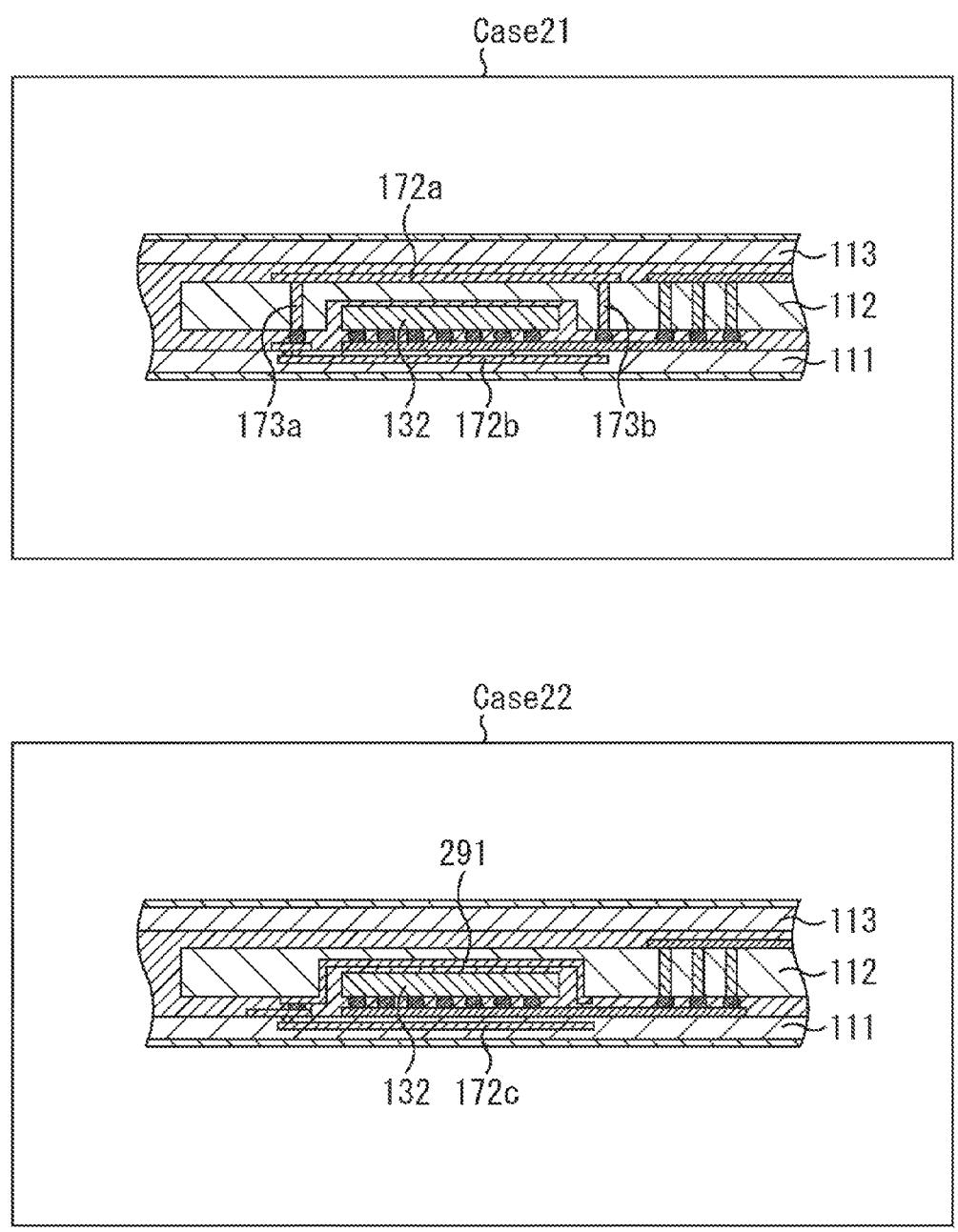
FIG. 11 is a diagram for explaining an example in which a metal shield is formed.

That is, in Case 21 shown in FIG. 11, a multilayer wiring 172*a* and through glass vias 173*a* and 173*b* in the wiring substrate 112 and a multilayer wiring 172*b* in the component mounted substrate 111 are structured so as to surround the IC 132, thereby achieving the metal shield structure. An upper surface side and a lower surface side of the mounted IC 132 are respectively covered with the multilayer wiring 172*a* on the front surface side of the wiring substrate 112 and the multilayer wiring 172*b* in the lower layer of the component mounted substrate 111, and on side surfaces of the IC 132, the through glass vias 173a and 173b are disposed so as to surround the cavity 152 in which the IC 132 is stored.

As a result, a pseudo waveguide structure, called parallel plate post-wall waveguide, is formed. In this structure, if a space between posts (in Case 21 shown in FIG. 11, space between the through glass vias 173a and 173b that surround the cavity 152) is sufficiently smaller than a wavelength, it is considered that a leakage of electromagnetic waves can be prevented. Therefore, by forming the structure in the substrate, it is possible to achieve a function of the electromagnetic shield.

In the formation of the through glass vias 173a and 173b with the photosensitive glass, as one characteristic of the present technology, it is possible to form through glass vias at a finer, narrower pitch than a print wiring substrate generally used for the post-wall waveguide. Therefore, it is possible to exert the shield effect with respect to waveguides of a higher frequency.

Further, in Case 22 shown in FIG. 11, a metal film 291 formed on an inner wall of the cavity 152 of the wiring substrate 112 which cover the IC 132 and a multilayer wiring 172c in a lower layer of the component mounted substrate 111 form a metal shield structure. The metal film 291 in the cavity 152 may also be formed as follows. In a process of manufacturing the component-embedded glass substrate described with reference to FIG. 7, when the via 201 for the through glass via of the wiring substrate 112b shown in FIG. 7 is opened, the cavity 152 is formed at the same time, and when the metal is filled in the through glass via, the metal film 291 may be formed in the cavity 152 at the same time. Further, in the case where the step in the cavity 152 is to be an obstacle in a subsequent wiring forming process, after all the steps described with reference to the flowchart shown in FIG. 6 are completed, the area excluding the cavity 152 is covered with a resist or the like, and the film may be formed by non-electrolytic plating or the like.

As described above, for the component-embedded glass substrate 101 according to the present disclosure which is obtained by laminating the multilayer wiring 172 and the component mounted substrate 111 that has been subjected to this, the metal shield structure can be formed in the vicinity of the IC 132 mounted by using the constituents as they are. Therefore, even if the substrate is used for a wiring communication apparatus or if the IC 132 with lower noise resistance is mounted thereon, it is possible to achieve a stable operation of the IC 132.

<Use as Casing of Electronic Apparatus>

In the present technology, the component-embedded glass substrate 101 can be attained with the components or the like weak against the heat load embedded therein, so it is possible to embed all the components necessary for an electronic apparatus in the substrate.

Figure 12:
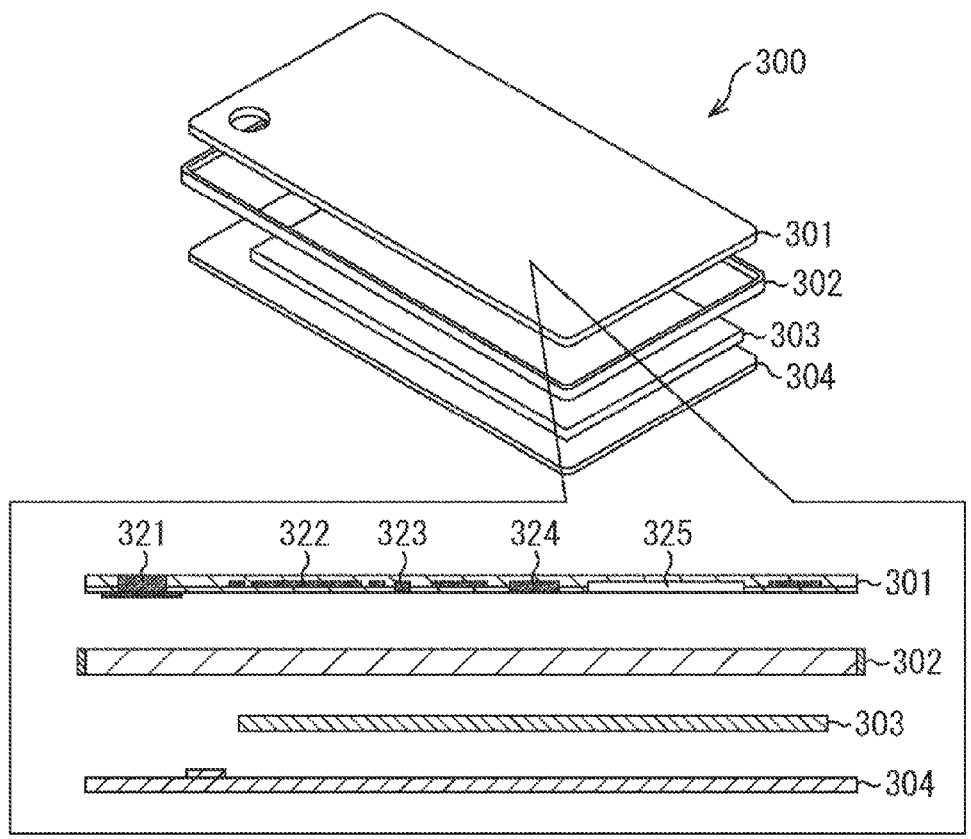
FIG. 12 is a diagram for explaining an example in which a thin-type smart phone that uses the component mounted glass substrate according to the present technology is formed.
Figure 12:
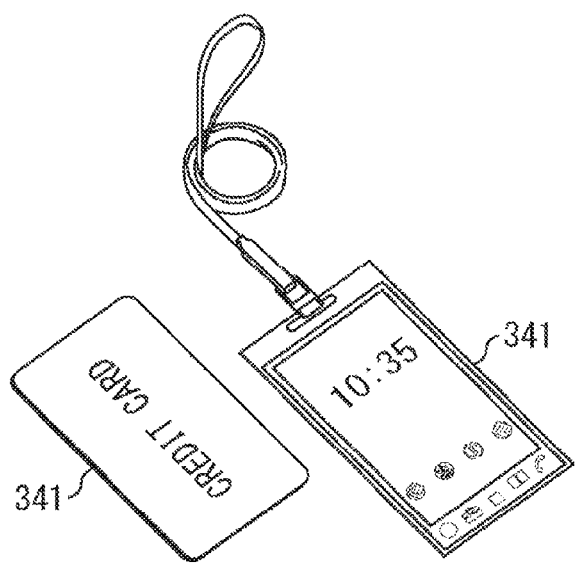

That is, the component-embedded glass substrate 101 according to the present technology can be used as a part of a casing of the electronic apparatus or the casing of the electronic apparatus. For example, as indicated by an upper part shown in FIG. 12, on a back surface panel of a smart phone 300, a system mount substrate 301 formed of the component-embedded glass substrate 101 according to the present technology may be used. It should be noted that the upper part of FIG. 12 shows an exploded view and a side view of the smart phone 300 that uses the system mount substrate 301 formed of the component-embedded glass substrate 101 according to the present technology on the back surface panel of the smart phone 300. A lower part of the figure shows a structure example of a smart phone 341 formed of only the system mount substrate 301.

The smart phone 300 shown in the upper part of FIG. 12 is constituted of the system mount substrate 301 formed of the component-embedded glass substrate 101 according to the present technology, a frame 302 that forms a side surface exterior of a main body, a battery 303, and a main display 304. The battery 303 is mounted with the battery sandwiched between the system mount substrate 301 as the exterior and the main display 304 including a touch panel, and a side surface portion is surrounded by the frame 302. Further, in the system mount substrate 301, a camera module 321 formed of an optical sensor, an application processor 322 that executes various programs, a function chip 323 that executes various functions, a sensor 324 formed of an acceleration sensor, a GPS (Global Positioning System) sensor, or the like, and a sub-display 325 formed of a compact display unit are mounted.

That is, in the smart phone 300 shown in the upper part of FIG. 12, all the components excluding the battery 303 for which a capacity is necessary and the main display 304 with the touch panel, having approximately the same size as the casing area, are set as the system mount substrate 301 formed of the component-embedded glass substrate 101 according to the present technology, which doubles as a back panel of the casing. In this case, in the structure of the component-embedded glass substrate 101 shown in the lower part of FIG. 5, chemical strengthening glass is used for a cover glass 103, which has a structure contributed to the use as a casing surface. Further, by using the component-embedded glass substrate 101 according to the present technology having optical permeability, it is possible to embed the sub-display 325 on the back surface side, while the main display 304 is provided on the front surface side. In addition, for the components as a heat generation source, such as the application processor 322, in related art, an in-casing mount substrate for which high-density mounting is necessary is used. In contrast, in the system mount substrate 301 formed of the component-embedded glass substrate 101 according to the present technology, an entire panel area on the back surface side can be approximately freely used for the layout of the components, so hot spots can be distributed.

Further, by using only the component-embedded glass substrate 101 as the casing, it is also possible to achieve a smart phone 341 having a credit card size as shown in a lower part of FIG. 12. A lower right part of FIG. 12 shows a state in which the main display 304 on the back surface side of the smart phone 341 is placed with the display directed upward, and a lower left part of FIG. 12 shows a state in which a back surface on which a "CREDIT CARD" is placed with the card directed upward. In this case, the description of the "CREDIT CARD" just indicates that the smart phone 341 has the credit card size and does not indicate that the smart phone has a function as a credit card or the like.

It should be noted that, as shown in the lower part of FIG. 12, in the case of the smart phone 341 that uses the component-embedded glass substrate 101 according to the present technology as the extremely thin casing surface, the thin glass can be curved, thereby making it possible to apply a casing having a curved shape such as a wrist watch type.

<Embedment of Lens Structure>

The component-embedded glass substrate 101 according to the present technology is formed by bonding the plurality of glass substrates that form a 3D shape. In particular, by using the photosensitive glass, the 3D shape can be freely formed. In view of this, by utilizing the characteristic, a lens structure formed of photosensitive glass may be formed.

Figure 13:
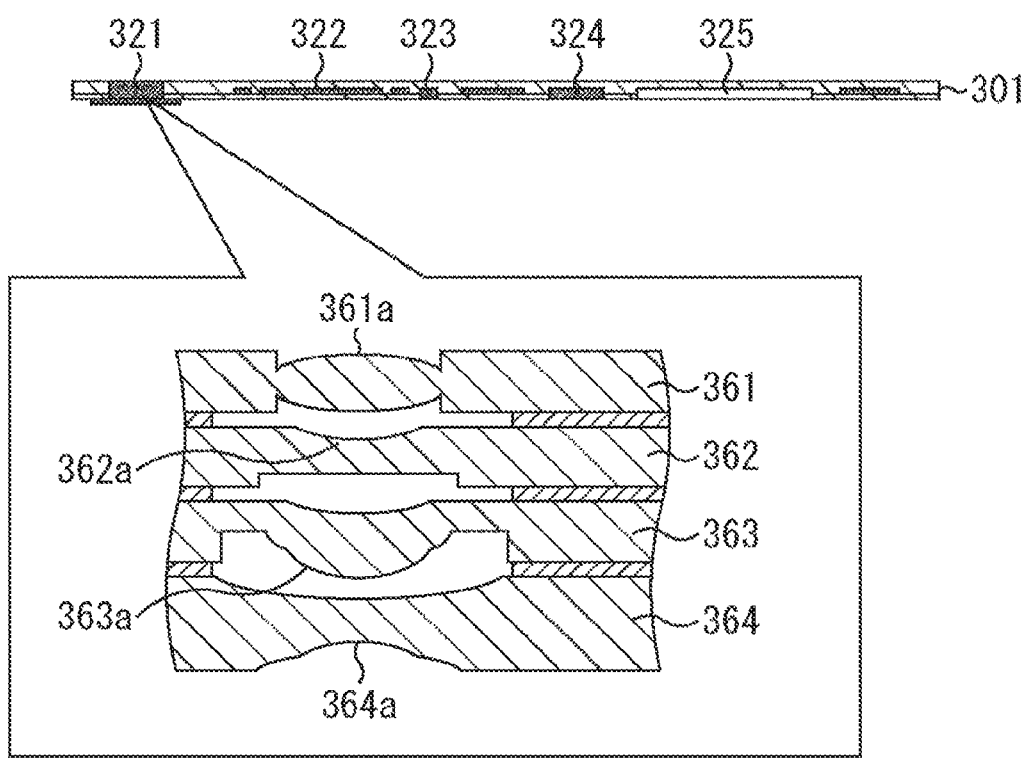
FIG. 13 is a diagram for explaining an example in which a plurality of lenses are layered on the component mounted glass substrate according to the present technology.

That is, as shown in FIG. 13, an optical block constituted of a plurality of lenses in the camera module 321 of the system mount substrate 301 as shown in the upper part of FIG. 12 may be achieved by a plurality of component-embedded glass substrates 361 to 364.

Generally, a lens part of the camera module 321 is formed by combining a plurality of lenses. However, in the camera module 321 shown in FIG. 13, lenses are formed as lenses 361a to 364a in a part of the glass substrates that respectively form the component-embedded glass substrates 361 to 364, and the component-embedded glass substrates 361 to 364 are bonded, thereby causing the lenses to function as one lens block.

The case where the lens can be formed with the same number of lenses as the component-embedded glass substrates 361 to 364 like the component-embedded glass substrate 101 is as described above. Even in the case where a greater number of lenses are necessary, by forming a part thereof on the component-embedded glass substrate side, it is possible to reduce the thickness of the camera module 321 with the lens to be mounted. Therefore, it is possible to contribute to thickness reduction for an entire casing of an electronic apparatus that uses the module.

As described above, according to the present technology, by forming the cavity and the through hole, it is possible to embed the components having different heights, including a large-sized component and a thin chip, in the glass substrate at the same time. In addition, it is possible to form the component-embedded glass substrate by bonding with the UV curable resin with the low heat load, so it is possible to embed a component weak against heat, such as a battery. Further, by using the chemical strengthening glass for the base material of the wiring substrate corresponding to the outer layer surface, it is possible to use the outer surface of the laminated component-embedded glass substrate as the casing surface as it is. Alternatively, this structure is provided on the front and back surfaces, it is possible to provide an extremely thin electronic apparatus with the component-embedded glass substrate itself as the casing.

Further, the transparent glass is the base material, so it is possible to embed a display and light-emitting and -reception device such as a display. By using a glass material, a thermal expansion coefficient of which is conformed to that of silicon (Si) (difference in the thermal expansion coefficient is equal to or less than 10 ppm/° C., for example) as the component mounted substrate, a larger-sized, lower IC (bare chip) can be mounted. In addition, because the component-embedded glass substrate is formed by laminating the plurality of glass wiring substrates, the thickness of the substrate in which the fine through glass via is formed is reduced, with the result that an aspect ratio of the vias, which is a bottleneck for the manufacture, can be reduced, and after the lamination with another substrate, the total thickness is increased, which can ensure an intensity of the casing. Further, the wiring layers necessary as the component mounted substrate can be disposed with the layers distributed to the plurality of substrates, so it is possible to relax warp due to a stress of the thin glass as the wiring substrate.

In addition, it is possible to form the micro flow channel at the time of forming the cavity. Therefore, it is possible to provide the component mounted substrate in which a cooling route is provided therein with high heat dissipation. Further, it is possible to form the metal shield by using the wiring layer, the through glass via, and the like, with the result that it is possible to mount the IC having a high noise resistance. Furthermore, it is possible to form the shape of the glass that forms the lens along with the forming of the cavity in the glass, so it is possible to form a part or all of the lens structure such as the camera module mounted on the component-embedded glass substrate according to the present technology in the substrate.

It should be noted that the present disclosure can take the following configurations.

(1) A method of manufacturing a wiring substrate that has a wiring including a through glass via and is formed of a glass substrate, the method including:

forming an alteration layer that penetrates the wiring substrate and is patterned;

forming the wiring on a front surface of the wiring substrate in which the alteration layer has been formed; and filling an electrode material in a hole formed by removing the alteration layer, thereby forming the through glass via that connects the wiring on the front surface of the wiring substrate and the wiring on a back surface side thereof.

(2) The method of manufacturing a wiring substrate according to Item (1), in which the glass substrate is formed of photosensitive glass in which the patterned alteration layer is capable of being formed by exposure and a heat treatment through a mask.

(3) The method of manufacturing a wiring substrate according to Item (1) or (2), in which the glass substrate is formed of non-photosensitive glass, and by exposure and a heat treatment through a mask, the patterned alteration layer is formed therein.

(4) The method of manufacturing a wiring substrate according to any one of Items (1) to (3), in which the patterned alteration layer is formed by collected laser pulse irradiation.

(5) The method of manufacturing a wiring substrate according to any one of Items (1) to (4), in which the patterned alteration layer is removed by using a chemical having selectivity with the glass.

(6) The method of manufacturing a wiring substrate according to any one of Items (1) to (5), in which the wiring substrate includes an active element in addition to the through glass via and the wiring.

(7) The method of manufacturing a wiring substrate according to Item (6), in which a difference between a thermal expansion coefficient of the patterned alteration layer and a thermal expansion coefficient of a non-alteration layer other than the alteration layer is smaller than approximately 5 ppm/° C.

(8) A wiring substrate that is manufactured by the method of manufacturing a wiring substrate according to Item (1).

(9) A method of manufacturing a component-embedded glass substrate formed by combining a first glass wiring substrate and a second glass wiring substrate on which a component is mounted.

(10) The method of manufacturing a component-embedded glass substrate according to Item (9), in which the first and second glass wiring substrates are bonded to each other with a light curing resin.

(11) The method of manufacturing a component-embedded glass substrate according to Item (9) or (10), in which when a resin is applied to bond the first and second glass wiring substrates by pressure, a structure for preventing expansion of an applied area, which has one of a protruded shape and a depressed shape is formed on one of the first and second glass wiring substrates.

(12) The method of manufacturing a component-embedded glass substrate according to any one of Items (9) to (11), in which the first glass wiring substrate includes a through glass via for connecting upper and lower wirings and a through hole and a cavity corresponding to a size of a component to be mounted on the second glass wiring substrate.

(13) The method of manufacturing a component-embedded glass substrate according to any one of Items (9) to (12), in which a base material of the first and second glass wiring substrates is photosensitive glass.

(14) The method of manufacturing a component-embedded glass substrate according to any one of Items (9) to (13), in which a difference between a thermal expansion coefficient of a base material of the second glass wiring substrate on which an active element chip is mounted and a thermal expansion coefficient of a material of the active element chip is equal to or less than 10 ppm/° C.

(15) The method of manufacturing a component-embedded glass substrate according to any one of Items (9) to (14), in which a component mounted on the first glass wiring substrate includes entire surface-mountable components necessary for a semiconductor apparatus, a passive element, and a system structure, and includes a connection portion for mounting a component incapable of being mounted on a surface.

(16) The method of manufacturing a component-embedded glass substrate according to any one of Items (9) to (15), in which the component-embedded glass substrate further includes an outer layer surface that forms a casing surface of an electronic apparatus.

(17) The method of manufacturing a component-embedded glass substrate according to any one of Items (9) to (16), in which the component-embedded glass substrate further includes an outer layer surface made of chemical strengthening glass.

(18) The method of manufacturing a component-embedded glass substrate according to any one of Items (9) to (17), in which a display device is mounted toward an outer layer surface.

(19) The method of manufacturing a component-embedded glass substrate according to any one of Items (9) to (18), in which the component-embedded glass substrate includes, in an inner layer, a flow channel in which a refrigerant for cooling a mounted heat generation component is caused to flow.

(20) The method of manufacturing a component-embedded glass substrate according to any one of Items (9) to (19), in which a metal shield is disposed around a semiconductor apparatus mounted.

(21) The method of manufacturing a component-embedded glass substrate according to Item (20), in which the metal shield is constituted of a metal film formed on an inside wall of a cavity in the first glass wiring substrate which surrounds the semiconductor apparatus mounted and metal corresponding to another wiring layer.

(22) The method of manufacturing a component-embedded glass substrate according to Item (20), in which the metal shield is constituted of metal corresponding to wiring layers above and below the semiconductor apparatus mounted and a through glass via disposed to surround a cavity in the first glass wiring substrate which covers the semiconductor apparatus.

(23) The method of manufacturing a component-embedded glass substrate according to any one of Items (9) to (22), in which the component-embedded glass substrate includes a lens structure in a part thereof.

(24) A component-embedded glass substrate manufactured by the method of manufacturing a component-embedded glass substrate according to Item (9).

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a wiring substrate, comprising:
    forming an alteration layer in the wiring substrate, wherein the wiring substrate is a single continuous layer that extends from a front surface of the wiring substrate to a back surface of the wiring substrate, wherein the alteration layer is patterned within the wiring substrate such that the alteration layer extends through the continuous single layer from the front surface of the wiring substrate to the back surface of the wiring substrate, and wherein the wiring substrate comprises a glass substrate;
    forming a first wiring on the front surface of the wiring substrate;
    removing at least a portion of the alteration layer to form a through glass via in the glass substrate, wherein the through glass via does not extend through an additional wiring substrate; and
    filling an electrode material within the through glass via, wherein the electrode material connects the first wiring on the front surface of the wiring substrate to a second wiring on the back surface of the wiring substrate.

2. The method of manufacturing a wiring substrate according to claim 1, wherein
    the glass substrate is formed of photosensitive glass in which the patterned alteration layer is formed by exposure to a light source and a heat treatment through a mask.

3. The method of manufacturing a wiring substrate according to claim 1, wherein
    the glass substrate is formed of non-photosensitive glass, and by exposure and a heat treatment through a mask, the patterned alteration layer is formed therein.

4. The method of manufacturing a wiring substrate according to claim 1, wherein
    the patterned alteration layer is formed by collected laser pulse irradiation.

5. The method of manufacturing a wiring substrate according to claim 1, wherein
    the patterned alteration layer is removed by using a chemical having selectivity with the glass substrate, and the through glass via extends from the front surface of the wiring substrate to the back surface of the wiring substrate.

6. The method of manufacturing a wiring substrate according to claim 1, wherein
    the wiring substrate further comprises an active element, and
    the active element is formed prior to the electrode material being filled within the through glass via.

7. The method of manufacturing a wiring substrate according to claim 6, wherein
    a difference between a thermal expansion coefficient of the patterned alteration layer and a thermal expansion coefficient of a non-alteration layer other than the alteration layer is smaller than approximately 5 ppm/° C.

8. A wiring substrate manufactured by the method of manufacturing a wiring substrate according to claim 1.

* * * * *